United States Patent
Nagano et al.

(10) Patent No.: US 10,591,342 B2
(45) Date of Patent: Mar. 17, 2020

(54) LIQUID LEVEL DETECTION DEVICE, METHOD OF DETECTING LIQUID LEVEL, HIGH TEMPERATURE PLASMA RAW MATERIAL SUPPLY DEVICE AND EXTREME ULTRA VIOLET LIGHT SOURCE DEVICE

(71) Applicant: USHIO DENKI KABUSHIKI KAISHA, Tokyo (JP)

(72) Inventors: Akihisa Nagano, Tokyo (JP); Gota Niimi, Tokyo (JP)

(73) Assignee: USHIO DENKI KABUSHIKI KAISHA, Tokyo (JP)

( * ) Notice: Subject to any disclaimer, the term of this patent is extended or adjusted under 35 U.S.C. 154(b) by 341 days.

(21) Appl. No.: 15/528,369

(22) PCT Filed: Nov. 19, 2015

(86) PCT No.: PCT/JP2015/005796
§ 371 (c)(1),
(2) Date: May 19, 2017

(87) PCT Pub. No.: WO2016/084356
PCT Pub. Date: Jun. 2, 2016

(65) Prior Publication Data
US 2017/0350745 A1    Dec. 7, 2017

(30) Foreign Application Priority Data
Nov. 25, 2014  (JP) ................................ 2014-238082

(51) Int. Cl.
G01F 23/24     (2006.01)
H01L 21/027    (2006.01)
(Continued)

(52) U.S. Cl.
CPC .......... *G01F 23/24* (2013.01); *G01F 23/0007* (2013.01); *G01F 23/241* (2013.01);
(Continued)

(58) Field of Classification Search
CPC ..... G01F 23/24; G01F 23/0007; G01F 23/241
(Continued)

(56) References Cited

U.S. PATENT DOCUMENTS 6,563,328 B1 * 5/2003 Lenormand ........... G01F 23/268
324/663
7,732,794 B2 6/2010 Abe et al.
(Continued)

FOREIGN PATENT DOCUMENTS

JP    4779048 B2    9/2011
JP    5149514 B2    2/2013

OTHER PUBLICATIONS

International Search Report issued in PCT/JP2015/005796; dated Dec. 15, 2015.

*Primary Examiner* — Tarun Sinha
(74) *Attorney, Agent, or Firm* — Studebaker & Brackett PC

(57) ABSTRACT

Disclosed herein a liquid level detection device capable of appropriately detecting a liquid level of a high temperature plasma raw material in a reservoir for storing the high temperature plasma raw material. The liquid level detection device includes: an upper limit level sensor configured to detect that the liquid level of the tin is elevated from downward to reach an upper limit level; and a refilling level sensor configured to detect that the liquid level of the tin is lowered from upward to reach a refilling level or a lower limit level. A detection responsiveness of the liquid level of the upper limit level sensor is higher than the refilling level sensor or the lower limit level sensor, and a detectability of
(Continued)

the liquid level of the refilling level sensor or the lower limit level sensor is higher than the upper limit level sensor.

17 Claims, 10 Drawing Sheets

(51) Int. Cl.
   *H05G 2/00* (2006.01)
   *G01F 23/00* (2006.01)
   *G03F 7/20* (2006.01)
   *G05D 9/12* (2006.01)
   *G21K 5/00* (2006.01)
(52) U.S. Cl.
   CPC ........... *G03F 7/70033* (2013.01); *G05D 9/12* (2013.01); *G21K 5/00* (2013.01); *H01L 21/027* (2013.01); *H05G 2/005* (2013.01); *H05G 2/008* (2013.01); *G01F 23/242* (2013.01)
(58) Field of Classification Search
   USPC ........................................................ 73/304 R
   See application file for complete search history.

(56) References Cited

U.S. PATENT DOCUMENTS

| | | | |
|---|---|---|---|
| 8,154,000 B2 | 4/2012 | Hergenhan et al. | |
| 2007/0079653 A1* | 4/2007 | Zuleta | G01F 23/243 |
| | | | 73/304 R |
| 2011/0011178 A1* | 1/2011 | Ulrich | G01F 23/242 |
| | | | 73/292 |
| 2015/0308877 A1* | 10/2015 | Faraldi | G01F 23/0061 |
| | | | 73/304 R |

* cited by examiner

LIQUID LEVEL DETECTION DEVICE, METHOD OF DETECTING LIQUID LEVEL, HIGH TEMPERATURE PLASMA RAW MATERIAL SUPPLY DEVICE AND EXTREME ULTRA VIOLET LIGHT SOURCE DEVICE

FIELD OF THE INVENTION

The present invention relates to a liquid level detection device and a method of detecting a liquid level that are capable of detecting the liquid level of a high temperature plasma raw material in a liquid state, such as molten tin or the like, contained in a reservoir. The present invention also relates to a high temperature plasma raw material supply device that is capable of supplying the high temperature plasma raw material in a liquid state, such as the molten tin or the like, from the reservoir, and an extreme ultra violet light source device provided with the high temperature plasma raw material supply device.

DESCRIPTION OF THE RELATED ART

Recent years, as semiconductor integrated circuits have been micronized and highly integrated, a wavelength of the light source for exposure has been shortened as well. As a next-generation light source for exposing a semiconductor, in particular, a certain extreme ultra violet light source device that emits extreme ultra violet light having a wavelength of 13.5 nm (hereinafter also referred to as "EUV (Extreme Ultra Violet) light") has been developed (hereinafter also referred to as "EUV light source device").

Conventionally, several methods of generating the EUV light have been known in the EUV light source device. One method amongst those methods is a method in which an extreme ultra violet light radiation species (hereinafter also referred to as "EUV radiation species") is heated and excited to generate the high temperature plasma and the EUV light is extracted from the generated high temperature plasma.

The EUV light source devices employing such method fall into two categories, that is, a Laser Produced Plasma (LPP) type and a Discharge Produced Plasma (DPP) type.

An EUV light source device of the DPP type applies the high voltage between electrodes to which a discharge gas containing the extreme ultra violet light radiation source is supplied to generate a high density and high temperature plasma by the discharge and the extreme ultra violet light radiated therefrom is used. In the DPP type light source device, a certain method has been proposed in which the high temperature plasma raw material in a liquid state (for example, Sn (tin)) is supplied to a surface of the electrode for generating the discharge, the high temperature plasma raw material is irradiated with an energy beam such as a laser beam to evaporate the raw material, and subsequently the high temperature plasma is generated by the discharge. This kind of method is also referred to as a Laser Assisted Discharge Plasma (LDP) method.

An EUV light source device of the LDP type is provided with a pair of electrodes in a disk shape which are rotatably arranged and apart from each other by a predetermined interval. Apart of those electrodes is immersed in a container containing the high temperature plasma raw material in the liquid state, and has a configuration in which the high temperature plasma raw material is transported into the discharge region with the electrodes being rotated.

In this kind of EUV light source device of the LDP type, a reservoir with a relatively large capacity is separately prepared and the high temperature plasma raw material is in advance contained in the reservoir. Then, the high temperature plasma raw material is supplied from the reservoir to the above mentioned container.

On the other hand, an EUV light source device of the LPP type supplies the high temperature plasma raw material in a liquid droplet state from the reservoir containing the high temperature plasma raw material in the liquid state through a raw material supply nozzle into a vacuum chamber. Then, the EUV light source device of the LPP type irradiates the high temperature plasma raw material in the liquid droplet state with the laser light for excitation, excites the high temperature plasma raw material to generate the high temperature plasma and radiates the EUV light.

In either type of the EUV light source devices, the high temperature plasma raw material is being consumed during the EUV radiation occurring. For this reason, those types of the EUV light source devices, a storage amount of the high temperature plasma raw material in the liquid state contained in the reservoir gradually decreases.

Accordingly, it is required to periodically refill (or restock) the high temperature plasma raw material into the reservoir in order to operate the EUV light source device for long periods of time in a stable manner. When refilling the reservoir with the high temperature plasma raw material, it is required to monitor the residual quantity of the high temperature plasma raw material. Because the high temperature plasma raw material contained in the reservoir is in the liquid state, the above mentioned monitoring in general employs a method of detecting a liquid level of the high temperature plasma raw material in the liquid state.

For example, Patent Literature 1 (Japanese Patent Publication No. 4779048 B) has proposed a certain technique concerning a method of detecting the liquid level of the high temperature plasma raw material in the liquid state. This technique uses, by using a nature that a reservoir is in general constituted with a conductive material such as metal or the like and the tin serving as the high temperature plasma raw material is electrically conductive, an electrode type level sensor for electrically detecting the liquid level of tin. In other words, a metal rod (that is, an electrode), which serves as a sensing unit, is arranged inside the reservoir for containing (or storing) the tin, and the liquid level is detected by determining the presence/absence of an energization of the current between the metal rod and the reservoir. This type of the liquid level sensor of the electrode type has a configuration to electrically detect an open state or closed state of the circuit so that the liquid level sensor has a higher detection responsiveness.

On the other hand, Patent Literature 2 (Japanese Patent Publication No. 5149514 B) has proposed a certain technique concerning another method of detecting the liquid level of the high temperature plasma raw material in the liquid state. This technique employs a thermocouple for detecting the liquid level of the tin by determining the change in temperature or a laser displacement gauge for detecting the liquid level of the tin by determining the reflection of the laser light.

LISTING OF REFERENCES

Patent Literatures

Patent Literature 1: Japanese Patent Publication No. 4779048 B

Patent Literature 2: Japanese Patent Publication No. 5149514 B

SUMMARY OF THE INVENTION

Problems to be Solved by the Invention

In the meantime, films of impurities, which are electrically conductive, increasingly float on the liquid surface of the tin contained in the reservoir. When the reservoir has a configuration into which the solid tin is to be refilled, the impurities may include a tin oxide film which covers the surface of the solid tin to be supplied to the reservoir, a reactant in which the tin reacts with a part of metal constituting the reservoir or the like, or a compound in which the tin is combined with a residual gas in the vacuum atmosphere. Most of those impurities have the specific gravity lighter than the tin in the liquid state so as to float on the liquid surface of the tin in the liquid state.

In the technique disclosed in the above mentioned Patent Literature 1 (Japanese Patent Publication No. 4779048 B), as shown in FIG. 11, the metal rod 901 serving as the sensing unit is arranged inside the reservoir 912 for containing the tin 911 in the liquid state, and an end portion opposite to a sensing end portion of the metal rod 901 is connected to one end of the battery 903 through a detection unit 902 such as an ammeter or the like. Also, the other end portion of the battery 903 is connected to an outer wall surface of the reservoir 912.

When detecting the liquid level of the tin 911 by the liquid level sensor having a configuration as shown in FIG. 11, in normal circumstances, when the liquid level of the tin 911 falls below the height of the sensing end portion of the metal rod 901, both of them electrically become in an open state. Thus, the liquid level sensor is capable of electrically detecting that the liquid level of the tin 911 falls below the prescribed liquid level.

However, when the above mentioned impurity film X is present, as shown in FIG. 11, a part of the impurity film X clings damply to the metal rod 901. For this reason, the impurity film X connects the metal rod 901 to the tin 911 even if the liquid level of the tin 911 falls below the height of the sensing end portion. As the impurity film X is electrically conductive, resultantly, the impurity film X inevitably short circuits a front edge of the metal rod 901 to the liquid surface of the tin 911. As a result, it becomes likely to fail to detect that the liquid level of the tin 911 falls below the height of the sensing end portion, or otherwise the timing to detect becomes likely to be delayed. Although the reservoir 912 is to be refilled with the tin 911 when the liquid level falls below the predetermined level, if the detection of the liquid level is not appropriately performed or is otherwise delayed, the tin 911 to be contained in the reservoir 912 is likely to be depleted or the refilling timing is likely to be delayed. In addition, a necessary amount of the tin 911 to be refilled is made unclear or imprecise.

On the other hand, in the technique disclosed in the above mentioned Patent Literature 2 (Japanese Patent Publication No. 5149514 B), because the disclosed method employs a configuration in which the liquid level is detected by a temperature sensor such as the thermocouple or the like, the response speed thereof is slow. Here, when the tin, which serves as the high temperature plasma raw material, is filled into the reservoir, it is required to set an upper limit value of the liquid level of the tin to be contained in the reservoir, detect that the liquid level has reached the upper limit level, and then stop the filling.

However, in a case of a liquid level sensor having a slow response speed such as the temperature sensor, the timing is likely to be delayed to detect that the liquid level reaches the upper limit level. Also, in some cases, defects are likely to occur in which the tin is excessively supplied exceeding the capacity of the reservoir so as to leak to the exterior.

In addition, when a laser displacement gauge is employed as the liquid level sensor, it is required to provide a laser observation window at the reservoir so that the structure becomes complicated. Also, an evaporated tin reaches the laser observation window and then solidified so that it becomes difficult to observe the liquid level of the tin.

The present invention has been made in view of the above mentioned circumstances and an object thereof is to provide a liquid level detection device and a method of detecting a liquid level that are capable of appropriately detecting a liquid level of the high temperature plasma raw material (that is, a storage amount thereof) in a reservoir for containing the high temperature plasma raw material in a liquid state such as molten tin or the like. Also, another object of the present invention is to provide a high temperature plasma raw material supply device that is capable of supplying the high temperature plasma raw material from the above mentioned reservoir in a stable manner and an extreme ultraviolet light source device provided with the high temperature plasma raw material.

Solution to the Problem

In order to solve the above mentioned problems, according to one aspect of the present invention, there is provided a liquid level detection device for detecting a liquid level of a high temperature plasma raw material in a liquid state contained in a reservoir for generating a high temperature plasma. The liquid level detection device comprises: a first liquid level detection unit configured to detect that a liquid level of the high temperature plasma raw material is elevated to reach a first liquid level; and a second liquid level detection unit having a configuration different from the first liquid level detection unit and configured to detect that the liquid level of the high temperature plasma raw material is lowered to reach a second liquid level that is lower than the first liquid level. Here, the first liquid level is an upper limit level that allows the high temperature plasma raw material to be contained in the reservoir. The first liquid level detection unit has a higher detection responsiveness of the liquid level than a detection responsiveness of the liquid level by the second liquid level detection unit. The second liquid level detection unit has a higher detectability of the liquid level than a detectability of the liquid level by the first liquid level detection unit.

In this way, the first liquid level detection unit for detecting an upper limit level is configured to be a liquid level detection unit having a higher detection responsiveness. Thus, it makes it possible to promptly detect that the liquid level of the high temperature plasma raw material is elevated to reach the upper limit level. Also, the second liquid level detection unit is configured to be a liquid level detection unit having a higher detectability (that is, detection accuracy). Thus, it makes it possible to certainly detect that the liquid level of the high temperature plasma raw material is lowered to reach the second level even if the impurity film floats on the liquid surface inside the reservoir.

In other words, when the upper limit level is to be detected, it makes it possible to suppress the delay of the detection timing to detect the liquid level, and when the lower liquid level than the upper limit level is to be detected, it makes it possible to detect the liquid level in a precise manner. As a result, it makes it possible to appropriately detect a status or situation in which the high temperature plasma raw material to be contained is likely to be overflowed to the exterior of the reservoir or likely to fall below the predetermined amount.

Also, in the above mentioned liquid level detection device, the first liquid level detection unit may be provided with an electrode rod arranged in the reservoir and having a front edge portion positioned at a same or a substantially same height as the first liquid level; and a conductive circuit configured to be in a conduction state when the front edge portion of the electrode rod contacts the high temperature plasma raw material.

In this way, by employing a configuration in which the liquid level is electrically detected, it makes it possible to make the response speed faster. Also, the electrode rod is kept contactless with the liquid surface unless the liquid level reaches the upper limit level. Thus, the deficiency hardly occurs in which the impurity film floating on the liquid surface clings damply to the electrode rod. For this reason, it makes it possible to appropriately detect the liquid level even when employing the configuration in which the liquid level is detected by determining that the electrode rod contacts the liquid level.

Yet furthermore, in the above mentioned liquid level detection device, a surface of the electrode rod may be made of a conductive material inert with respect to the high temperature plasma raw material.

With this configuration, it makes it possible to suppress the chemical reaction between the electrode rod and the high temperature plasma raw material so as to prevent the electrode rode from being corroded or damaged. For this reason, it makes it possible to detect the liquid level in a stable manner.

Yet also, in the above mentioned liquid level detection device, the electrode rod may have a stainless steel surface onto which the titanium nitride coating, which is an inert conductive material with respect to the high temperature plasma raw material, is applied.

With this configuration, it makes it possible to suppress the chemical reaction between the stainless steel and the high temperature plasma raw material, such as tin (Sn), so as to prevent an iron compound, for example, SnFe or $SnFe_2$ or the like, from being formed on the surface of the electrode rod. In this way, it prevents the chemical compound, which has a higher wettability with respect to the impurities floating on the liquid surface, from being formed. Accordingly, it makes it possible to prevent the impurities from being likely to cling damply to the electrode rod.

Yet furthermore, in the above mentioned liquid level detection device, a material of the surface of the electrode rod may be one of tungsten and molybdenum that is conductive material inert with respect to the high temperature plasma raw material.

In this way, as the electrode rod is formed by tungsten or molybdenum, it makes it possible to suppress the chemical reaction between the electrode rod and the high temperature plasma raw material and detect the liquid level in a stable manner. In addition, as the electrode rod itself is formed by the electrically conductive material that is inert with respect to the high temperature plasma raw material, it makes it possible to eliminate a coating process or the like with the electrically conductive material and to reduce the complexity of fabrication processes of the electrode rod.

Yet furthermore, in the above mentioned liquid level detection device, the first liquid level detection unit may include a tubular member configured to be fitted onto the electrode rod and configured with a material having an anticorrosion property and an electrically insulating property to the high temperature plasma raw material, and a front edge portion of the electrode rod may be exposed from the tubular member toward the liquid surface of the high temperature plasma raw material.

In this way, the electrode rod has a configuration in which the electrode rod is inserted into the tubular member having the anticorrosion property and the electrically insulating property to the high temperature plasma raw material. Thus, an erroneous detection of the liquid level can be avoided even when the impurity film floating on the liquid surface supposedly clings damply to the electrode rod. As a result, it makes it possible to detect the liquid level in a further stable manner.

Yet furthermore, in the above mentioned liquid level detection device, a material of the tubular member may be aluminum oxide. With this configuration, it makes it possible to detect the liquid level in a stable manner with a relatively inexpensive configuration.

Yet furthermore, in the above mentioned liquid level detection device, the electrode rod may be arranged such that a longitudinal direction thereof coincides or substantially coincides with a vertical direction. With this configuration, it makes it possible to facilitate the impurity film to abscise by gravity even when the impurity film floating on the liquid surface supposedly clings damply to the electrode rod.

Yet furthermore, in the above mentioned liquid level detection device, the second liquid level detection unit may be provided with a temperature sensor arranged in the reservoir and configured to be positioned at a same or a substantially same height as the second liquid level.

With this configuration, it makes it possible to detect that the liquid level is lowered to reach the second liquid level based on a change in a detected temperature (that is, temperature decrease) of a sensing unit when the sensing unit transitions from a state in which the sensing unit is immersed in the high temperature plasma raw material in a liquid state to a state in which the sensing unit is exposed from the liquid surface. In this way, in a case of the liquid level detection using the change in temperature, even when the impurity film floating on the liquid surface clings damply to the sensing unit, it hardly affects the detection accuracy. For this reason, it makes it possible to attain the liquid level detection with a higher reliability.

Yet furthermore, in the above mentioned liquid level detection device, a surface of the temperature sensor may be constituted with a material that is inert with respect to the high temperature plasma raw material.

With this configuration, it makes it possible to suppress the chemical reaction between the temperature sensor and the high temperature plasma raw material and prevent the temperature sensor from being corroded or damaged. Accordingly, it makes it possible to detect the liquid level in a stable manner.

Yet furthermore, in the above mentioned liquid level detection device, the material constituting the surface of the temperature sensor that is inert with respect to the high temperature plasma raw material may be any of titanium nitride, tin oxide, aluminum oxide, diamond, tungsten, and molybdenum.

In this way, it makes it possible to detect the liquid level in a further stable manner by coating the surface of the temperature sensor by the material inert with respect to the high temperature plasma raw material or forming the surface portion of the temperature sensor with the material inert with respect to the high temperature plasma raw material.

Also, according to another aspect of a liquid level detection device of the present invention, there is provided a liquid level detection device for detecting a liquid level of a high temperature plasma raw material in a liquid state contained in a reservoir for generating a high temperature plasma. The liquid level detection device comprises: an electrode rod having a front edge portion thereof arranged to be positioned at a same or a substantially same height as a predetermined liquid level in the reservoir and a surface thereof constituted with a conductive material inert with respect to the high temperature plasma raw material; a tubular member configured to be fitted onto the electrode rod such that the front edge portion of the electrode rod is exposed toward a liquid surface of the high temperature plasma raw material and constituted with a material having an anticorrosion property and an electrically insulating property to the high temperature plasma raw material; and a conductive circuit configured to be in (or turn into) a conductive state when the front edge portion of the electrode rod contacts the liquid level of the high temperature plasma raw material. In this case, the electrode rod may have a stainless steel surface onto which a titanium nitride coating is applied, and a material of the tubular member may be aluminum oxide.

In this way, by employing a configuration in which the liquid level is electrically detected, it makes it possible make the response speed faster. Also, by employing a configuration in which the electrode rod has the stainless steel surface onto which the titanium nitride coating is applied, it makes it possible to suppress the chemical reaction between the electrode rod and the high temperature plasma raw material and prevent the chemical compound having a higher wettability to the impurity floating on the liquid surface from being formed on the surface of the electrode rod. With this configuration, it makes it possible to prevent the impurities from clinging damply to the electrode rod. In addition, by employing a configuration in which the electrode rod is inserted into a tubular member formed by aluminum oxide, it makes it possible to prevent the erroneous detection of the liquid level from occurring even when the impurities supposedly cling damply thereto. In other words, it makes it possible to assure both detection responsiveness and detection accuracy so as to appropriately detect the liquid level.

Furthermore, according to one aspect of a method of detecting a liquid level of the present invention, there is provided a method of detecting a liquid level of a high temperature plasma raw material in a liquid state contained in a reservoir for generating a high temperature plasma. The method comprises: detecting, using a first liquid level sensor, that a liquid level of the high temperature plasma raw material is elevated to reach a first liquid level that is an upper limit level to allow the high temperature plasma raw material to be contained in the reservoir; and detecting, using a second liquid level sensor, that the liquid level of the high temperature plasma raw material is lowered to reach a second liquid level that is lower than the first liquid level; using, as the first liquid level sensor, a liquid level sensor having a higher detection responsiveness of the liquid level than a detection responsiveness of the liquid level by the second liquid level sensor; and using, as the second liquid level sensor, a liquid level sensor having a higher detectability of the liquid level than a detectability of the liquid level of the first liquid level sensor.

By doing this, it makes it possible to suppress a delay in a detection timing of the liquid level when detecting an upper limit level, and to precisely detect the liquid level when detecting a liquid level lower than the upper limit level. As a result, it makes it possible to appropriately detect a situation in which, for example, the high temperature plasma raw material contained is likely to be overflowed outside the reservoir or likely to fall below the predetermined amount.

Yet furthermore, according to one aspect of a high temperature plasma raw material supply device of the present invention, there is provided a high temperature plasma raw material supply device that supplies a high temperature plasma raw material in a liquid state contained in a reservoir to a high temperature plasma generation unit for generating the high temperature plasma. The high temperature plasma raw material supply device comprises: the liquid level detection device according to any one of the above mentioned liquid level detection devices; and a high temperature plasma filling controller configured to fill the reservoir with the high temperature plasma raw material based on a liquid level of the high temperature plasma raw material detected by the liquid level detection device.

With this configuration, it makes it possible to control the high temperature plasma raw material contained in a reservoir to be constantly in an appropriate amount. As a result, it makes it possible to supply the high temperature plasma raw material to the high temperature plasma generation unit in a stable manner.

Yet furthermore, in the above mentioned high temperature plasma raw material supply device, the second liquid level may be a to-be-filled level in which the high temperature plasma raw material is required to be filled in the reservoir, and the high temperature plasma filling controller may include: a filling start (starting) unit configured to start filling the high temperature plasma raw material in the reservoir when the second liquid level detection unit detects that the liquid level of the high temperature plasma raw material in the reservoir reaches the to-be-filled level; and a filling stop (stopping) unit configured to stop filling the high temperature plasma raw material in the reservoir when the first liquid level detection unit detects that the liquid level of the high temperature plasma raw material in the reservoir reaches the upper limit level after the filling start unit starts filling the high temperature plasma raw material.

In this way, filling of the high temperature plasma raw material into the reservoir starts when the high temperature plasma raw material in the reservoir is reduced to reach the to-be-filled level, and subsequently filling of the high temperature plasma raw material into the reservoir stops when the high temperature plasma raw material in the reservoir is increased to reach to the upper limit level. As a result, it makes it possible to constantly control a storage (containing) amount of the high temperature plasma raw material in the reservoir from the to-be-filled level to the upper limit level.

Yet furthermore, in the above mentioned high temperature plasma raw material supply device, the high temperature plasma raw material supply device may include: a filled amount measurement unit configured to measure an actual measured (actually-measured) filled amount that is an amount of the high temperature plasma raw material filled in the reservoir from when the filling start unit starts filling the high temperature plasma raw material into the reservoir until the filling stop unit stops filling the high temperature plasma raw material in the reservoir; and an error information output unit configured to compare the actual measured filled amount measured by the filled amount measurement unit with a reference (referential) to-be-filled (filling) amount fillable in the reservoir from when the liquid level of the high temperature plasma raw material in the reservoir is at the to-be-filled level until the liquid level of the high temperature plasma raw material reaches the upper limit level, and to output error information when a difference therebetween exceeds an allowable value preset in advance.

In this way, based on a detection result of the liquid level by the liquid level detection device, an amount of the high temperature plasma raw material filled in the reservoir (that is, an actual measured filled amount) is compared with an amount of the high temperature plasma raw material fillable in the reservoir from when the liquid level is at the to-be-filled level until the liquid level reaches the upper limit level (that is, a referential to-be-filled (or filling) amount). Thus, it makes it possible to determine the correctness (right or wrong) of the detection result of the liquid level by the liquid level detection device. In this case, when the difference between the actual measured (actually-measured) filled amount and the referential to-be-filled amount exceeds the allowable value, then it is determined that the detection result of the liquid level by the liquid level detection device is incorrect so to as output the error information. Thus, it makes it possible to perform a process of, for example, notifying an operator of the incorrectness or stopping the filling control or the like.

Yet furthermore, in the above mentioned high temperature plasma raw material supply device, the high temperature plasma raw material supply device may include: a third liquid level detection unit having a same configuration as the second liquid level detection unit and configured to detect that the liquid level of the high temperature plasma raw material is lowered to reach a third liquid level that is a lower limit level in which the high temperature plasma raw material is required to be contained at minimum in the reservoir; and a high temperature plasma raw material supply stop unit configured to stop supplying the high temperature plasma raw material from the reservoir to the high temperature plasma generation unit when the third liquid level detection unit detects that the liquid level of the high temperature plasma raw material in the reservoir reaches the lower limit level.

In this way, the third liquid level detection unit with a higher accuracy having the same configuration as the second liquid level detection unit detects that the liquid level is lowered to reach the lower limit level. Thus, it makes it possible to ensure to detect the lower limit level. In addition, the supply of the high temperature plasma raw material from the reservoir to the high temperature plasma generation unit is stopped when detecting that the liquid level of the high temperature plasma raw material is lowered to reach the lower limit level. Thus, it makes it possible to prevent the supply process of the high temperature plasma raw material from continuing while the high temperature plasma raw material in the container is being depleted.

Yet furthermore, according to one aspect of an extreme ultraviolet light source device of the present invention, there is provided an extreme ultra violet light source device comprises: a high temperature plasma raw material supply device according to any of above mentioned high temperature plasma raw material supply devices; and a high temperature plasma generation unit configured to heat and excite the high temperature plasma raw material supplied from the high temperature plasma raw material supply device to generate a high temperature plasma.

With this configuration, it makes it possible to radiate extreme ultra violet light (EUV light) in a stable manner.

Advantageous Effect of the Invention

According to the above mentioned aspects of the liquid level detection device of the present invention, it makes it possible to appropriately detect a liquid level (storage or containing amount) of the high temperature plasma raw material in a liquid state contained in the reservoir.

As a result, according to the high temperature plasma raw material supply device provided with the liquid level detection unit, it makes it possible to supply the high temperature plasma raw material to the high temperature plasma generation unit in a stable manner, and the extreme ultra violet light source device is capable of radiating the extreme ultra violet light (EUV light) in a stable manner.

The above mentioned and other not explicitly mentioned objects, aspects and advantages of the present invention will become apparent to a skilled person from the following detailed description when read and understood in conjunction with the appended claims and drawings.

DETAILED DESCRIPTION OF THE INVENTION

Hereinafter, embodiments according to the present invention will be explained in detail with reference to the drawings attached hereto.

First Embodiment

Figure 1:
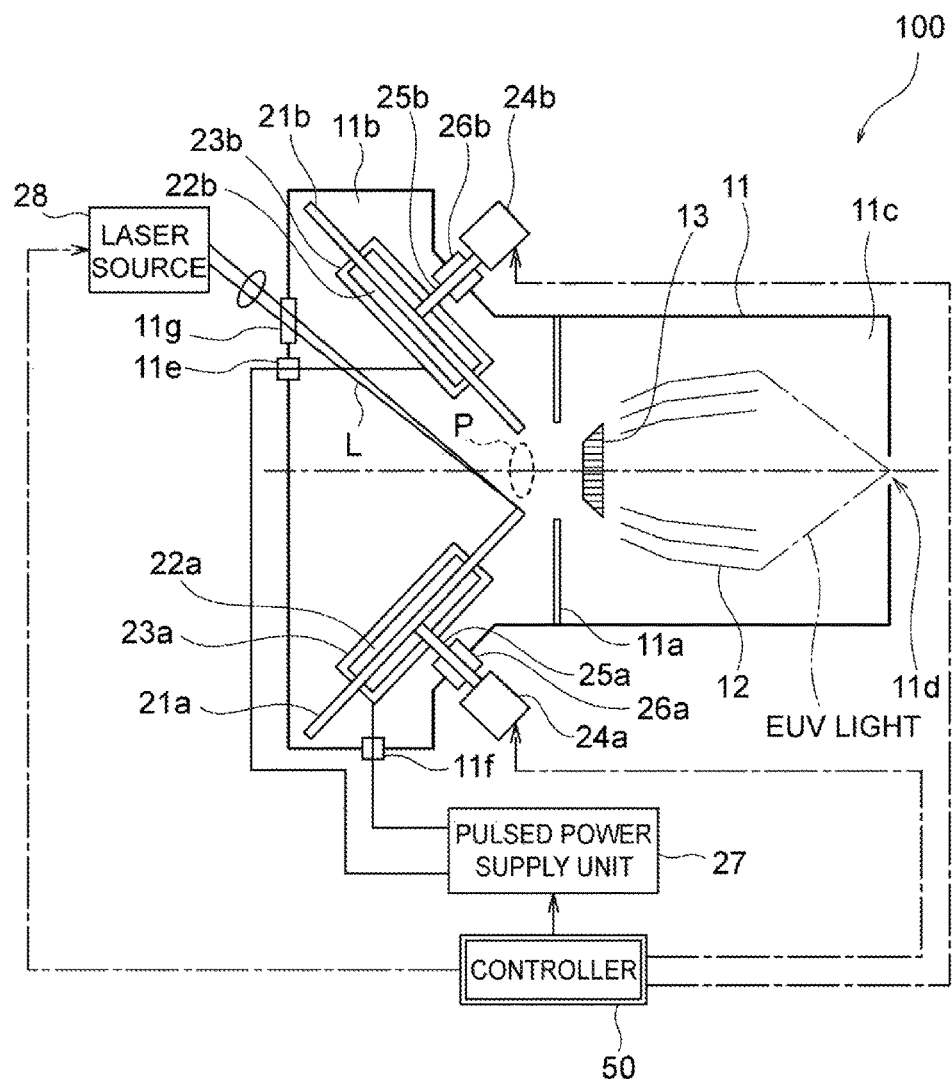
FIG. 1 is a schematic view showing a configuration of one illustrative example of an extreme ultra violet light source device according to the present embodiment.

FIG. 1 is a schematic view showing a configuration of one illustrative example of an extreme ultra violet light source device (EUV light source device) according to the present embodiment.

An EUV light source device 100 is a device that is usable as a light source for the exposure of a semiconductor, and radiates extreme ultra violet light (EUV light) having a wavelength of, for example, 13.5 nm.

The EUV light source device 100 according to the present embodiment is an EUV light source device of a DPP type. More particularly, the EUV light source device 100 is an EUV light source device of an LDP type that irradiates a high temperature plasma raw material supplied on an electrode surface, at which the discharge occurs, with an energy beam such as a laser beam or the like, evaporates the high temperature plasma raw material, and subsequently generates a high temperature plasma by the discharge.

The EUV light source device 100 is provided with, as shown in FIG. 1, a chamber 11 serving as a discharge vessel. The chamber 11 is partitioned into two spaces on a large scale by a partition wall 11*a* having an opening. One space is a discharge space 11*b* and the other space is a light condensing space 11*c*.

In the discharge space 11*b*, a pair of discharge electrodes 21*a* and 21*b*, each of which is capable of being rotated independently, are arranged opposite to each other to be apart from each other. The discharge electrodes 21*a* and 21*b* are electrodes that heat and excite the high temperature plasma raw material containing the EUV radiation species, respectively.

A pressure in the discharge space 11*b* is maintained in a vacuum atmosphere in order to appropriately generate the discharge for heating and exciting the high temperature plasma raw material.

In the light condensing space 11*c*, an EUV light condensing mirror (light condenser mirror) 12 and a debris trap 13 are arranged.

The EUV light condensing mirror 12 condenses the EUV light emitted by heating and exciting the high temperature plasma raw material, and introduces the EUV light from an EUV extraction unit 11*d* provided at the chamber 11 to, for example, an irradiation optical system of an exposure apparatus (not shown).

The EUV light condensing mirror 12 is, for example, a light condensing mirror of an oblique incidence type and has a configuration in which a plurality of thin concave mirrors are arranged to be nested with a higher accuracy. A shape of a reflection surface of each of the concave mirrors is, for example, an ellipsoid of revolution shape, a paraboloid of revolution type, or a Walter type shape, and each of the concave mirrors is in a rotary body shape. Here, the Walter type shape is a concave shape in which light incident surfaces thereof are made of, in turn from the light incident side, a hyperboloid of revolution and the ellipsoid of revolution, or otherwise the hyperboloid of revolution and the paraboloid of revolution.

The EUV light condensing mirror 12 has a reflection surface having a shape either of the ellipsoid of revolution or the Walter type or the like, and provided with a plurality of concave mirrors of the rotary bodies of which diameters differ from one another. Those concave mirrors constituting the EUV light condensing mirror are arranged with the center axes of rotation thereof overlapping with one another such that the focal positions substantially coincide with one another on the same axis. In this way, by arranging the concave mirrors to be nested high a higher accuracy, the EUV light condensing mirror 12 is capable of appropriately reflecting the EUV light at an oblique incidence angle of 0 degrees to 25 degrees and also condensing light at one point.

Also, a base material of each of the above mentioned concave mirrors is, for example, nickel (Ni) or the like. In order to reflect the EUV light having an extremely short wavelength, the reflection surface of each of the concave mirrors is constituted as an extremely smooth surface. The reflecting material applied to the smooth surface is a metal film of, for example, ruthenium (Ru), molybdenum (Mo), or rhodium (Rh) or the like. The reflecting surface of each of the concave mirrors is densely coated with this kind of metal film.

The debris trap 13 traps the debris generated as a result of the plasma generation by the discharge to prevent the debris from moving toward the light condensing unit of the EUV light.

A pair of discharge electrodes 21*a* and 21*b* arranged in the discharge space 11*b* are disk shaped members made of metal, respectively. The discharge electrodes 21*a* and 21*b* are made of high melting point metal such as tungsten, molybdenum, tantalum or the like, respectively. In this case, out of two discharge electrodes 21*a* and 21*b*, one discharge electrode 21*a* is a cathode and the other discharge electrode 21*b* is an anode.

The discharge electrode 21*a* is arranged such that a part of the discharge electrode is immersed in a container 23*a* containing the high temperature plasma raw material 22*a*. A rotating shaft 25*a* of a motor 24*a* is attached to a substantially center portion of the discharge electrode 21*a*. In other words, the discharge electrode 21*a* rotates by rotating the rotating shaft 25*a* by the motor 24*a*. The motor 24*a* is drive controlled by a controller 50.

Furthermore, the rotating shaft 25*a* is introduced into the chamber 11 through, for example, a mechanical seal 26*a*. The mechanical seal 26*a* allows the rotating shaft 25*a* to rotate while maintaining a reduced pressure atmosphere in the chamber 11.

The discharge electrode 21*b* is also arranged, similarly to the discharge electrode 21*a*, such that a part of the discharge electrode is immersed in a container 23*b* containing the high temperature plasma raw material 22*b*. A rotating shaft 25*b* of a motor 24*b* is attached to a substantially center portion of the discharge electrode 21*b*. In other words, the discharge electrode 21*b* rotates by rotating the rotating shaft 25*b* by the motor 24*b*. The motor 24*b* is drive controlled by a controller 50.

Furthermore, the rotating shaft 25*b* is introduced into the chamber 11 through, for example, a mechanical seal 26*b*. The mechanical seal 25*b* allows the rotating shaft 25*b* to rotate while maintaining a reduced pressure atmosphere in the chamber 11.

The high temperature plasma raw materials 22*a* and 22*b* in a liquid state mounted on surfaces of the discharge electrodes 21*a* and 21*b* are transported into a discharge region with the discharge electrodes 21*a* and 21*b* being rotated, respectively.

Here, the discharge region means a space in which the discharge occurs between both electrodes 21*a* and 21*b* and is a portion having the shortest distance between edge portions of peripheral portions of both electrodes 21*a* and 21*b*.

As the high temperature plasma raw material 22*a* and 22*b*, molten metal such as tin (Sn) in a liquid state may be used. This kind of high temperature plasma raw material 22*a* and 22*b* may also act as metal for power supply which supplies power to the discharge electrodes 21*a* and 21*b*, respectively.

Containers 23*a* and 23*b* are connected to a pulsed power supply unit 27 through power introduction units 11*f* and 11*g* having an insulating (insulation) property which is capable of maintaining inside the chamber 11 to be in the reduced pressure atmosphere. The containers 23*a* and 23*b* and tin 22*a* and 22*b* are all electrically conductive. Apart of the discharge electrode 21*a* and a part of the discharge electrode 21*b* are immersed in the tin 22*a* and 22*b*, respectively. For this reason, a pulsed power may be applied between the discharge electrodes 21*a* and 21*b* by applying a pulsed power between the containers 23*a* and 23*b* from the pulsed power supply unit 27.

It should be noted that, although not in particular shown, the containers 23a and 23b are provided with temperature adjusting mechanisms for maintaining the tin 22a and 22b in a molten state, respectively.

The pulsed power supply unit 27 applies the pulsed power (pulse power) having a short pulse width between the containers 23a and 23b, in other words, between the discharge electrodes 21a and 21b. The pulsed power supply unit 27 is drive controlled by the controller 50.

A laser source 28 is an energy beam irradiation unit that irradiates the tin 22a on the discharge electrode 21a, which is transported into the discharge space, with the laser light (that is, an energy beam). The laser source 28 is, for example, Neodymium-doped Yttrium Orthovanadate laser device (Nd:YVO$_4$ laser device).

The laser light L emitted from the laser source 28 enters into a window portion 11g of the chamber 11 through the laser light condensing unit or the like and is introduced on the discharge electrode 21a. The controller 50 controls an irradiation timing of the laser light by the laser source 28.

When the high temperature plasma raw material transported into the discharge space is irradiated with the laser light in a state in which the pulsed power supply unit 27 applies the pulsed power to the discharge electrodes 21a and 21b, then the high temperature plasma raw material is evaporated and the pulsed discharge between both electrodes 21a and 21b starts. As a result, a plasma P generated from the high temperature plasma raw material is formed. Subsequently, the plasma P is heated and excited and temperature thereof is made high by a high current flowing during the discharge so that the high temperature plasma P emits the EUV light.

It should be noted that, as described above, as the pulsed power supply unit 27 applies the pulsed power between the discharge electrodes 21a and 21b, the above mentioned discharge is made pulsed discharge, and the EUV light to be radiated is thus made pulsed light emitted in a pulsed manner.

The containers 23a and 23b are connected to a tin supply mechanism (that is, high temperature plasma raw material supply device) for supplying the tin 22a and 22b, respectively.

Hereinafter, the tin supply mechanism will be described in detail.

Figure 2:
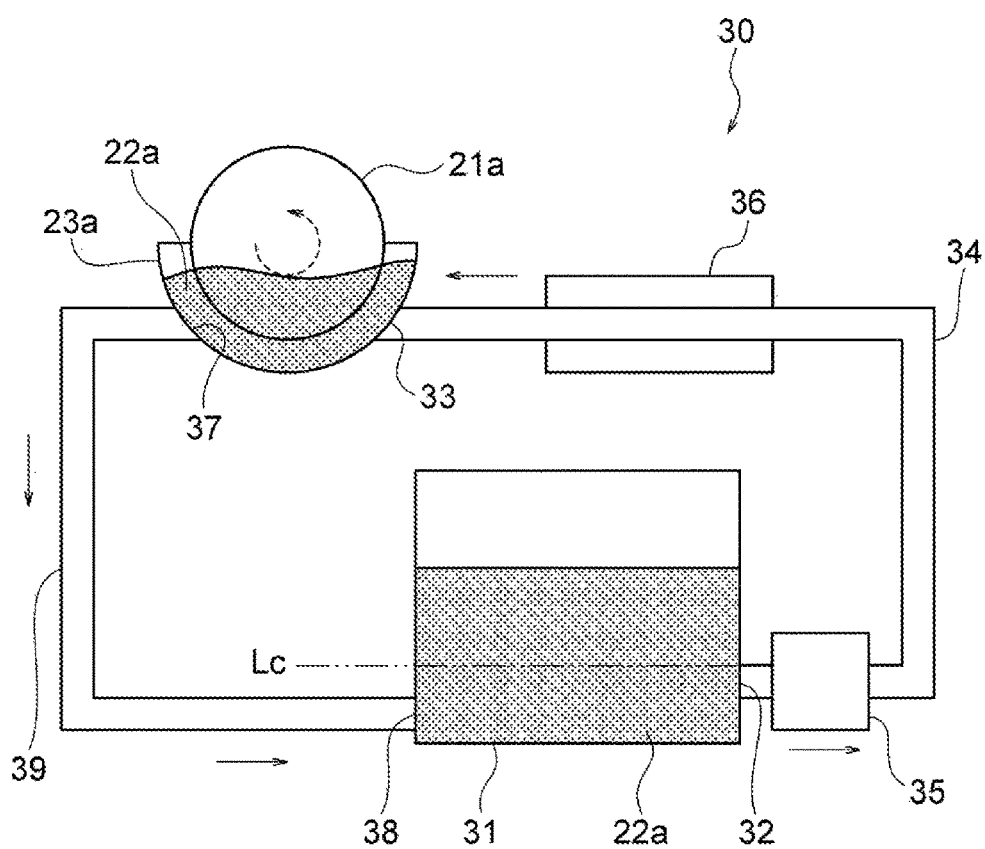
FIG. 2 is a view showing an illustrative example of a tin supply mechanism.

FIG. 2 is a view showing an exemplary configuration of a tin supply mechanism 30 for supplying tin 22a to the container 23a. It should be noted that, as a tin supply mechanism for supplying tin 22b to the container 23b also has a similar configuration to the tin supply mechanism as shown in FIG. 2, hereinafter the tin supply mechanism will be solely described for supplying the tin 22a to the container 23a.

The tin supply mechanism 30 is provided with a reservoir (vessel) 31 for containing the tin 22a. The reservoir 31 is designed so as to have a large capacity than the container 23a.

In the reservoir 31, a tin discharge port (exhaust port) 32 is formed at a lower portion of a side wall thereof (below a lower limit level $L_c$, which will be described later). The tin discharge port 32 is connected to a tin supply port 33 formed at the container 23a through a tin supply pipe (feed pipe) 34. The tin supply pipe 34 is provided with a pump 35, and the tin 22a in the reservoir 31 is supplied to the container 23a by driving the pump 35. Also, the tin supply pipe 34 is provided with a cooling mechanism 36 that allows the tin 22a to be at a predetermined set temperature.

Furthermore, in the container 23a, a tin discharge port (exhaust port) 37 through which the tin is discharged is formed, and the tin discharge port 37 is connected to a tin reflux (flow back) port 38 formed at the reservoir 31 through the tin discharge tube 39.

Here, the tin supply port 33 is formed in the vicinity of a region through which the discharge electrode 21a passes immediately before reaching the discharge region in the container 23a. Also, the tin discharge port 37 is formed in the vicinity of a region in which a part of the discharge electrode 21a irradiated with the laser light is immersed again in the tin 22a in the container 23a.

With the tin supply mechanism so configured, the tin at the predetermined set temperature is supplied to discharge electrode 21 before being irradiated with the laser light and also starting the discharge and transported into the discharge region. Also, even when the discharge electrode 21a heated by the generated discharge contacts the tin 22a in the container 23a and the tin 22a is excessively heated above the desired temperature, as the heated tin 22a is discharged from the container 23a, it hardly affects the tin 22a to be transported at the next time of the discharge.

The tin 22a, which is flowed back to the reservoir 31 through the tin discharge tube 39 and heated, is immixed with the tin 22a in the reservoir 31 so as to increase the overall temperature of whole tin 22a in the entire reservoir 31. However, as described above, the capacity of the reservoir 31 is larger than the capacity of the container 23a. For this reason, an amount of the tin 22a contained in the reservoir 31 is larger than an amount of the tin 22a flowed back to the reservoir 31 and heated so that the temperature increase of the tin 22a in the reservoir 31 is made gradual. As a result, the cooling mechanism 36 bears less load when the cooling mechanism 36 makes the temperature of the tin 22a flowing in the tin supply tube 34 to a desired set temperature.

In this way, the tin 22a contained in the reservoir 31 is supplied circulatingly to the container 23a.

During the EUV light radiation (generation of radiation) by the EUV light source device 100, as the tin serving as the high temperature plasma raw material is being consumed, the storage amount (containing amount) of the tin 22a in the reservoir 31 is gradually reduced. For this reason, the reservoir 31 is provided with a tin storage mechanism that monitors the storage amount of the tin 22a and supplements the tin 22a to the reservoir 31 so as to allow the storage amount of the tin 22a to be an appropriate amount.

Hereinafter the tin storage mechanism will be described in detail.

Figure 3:
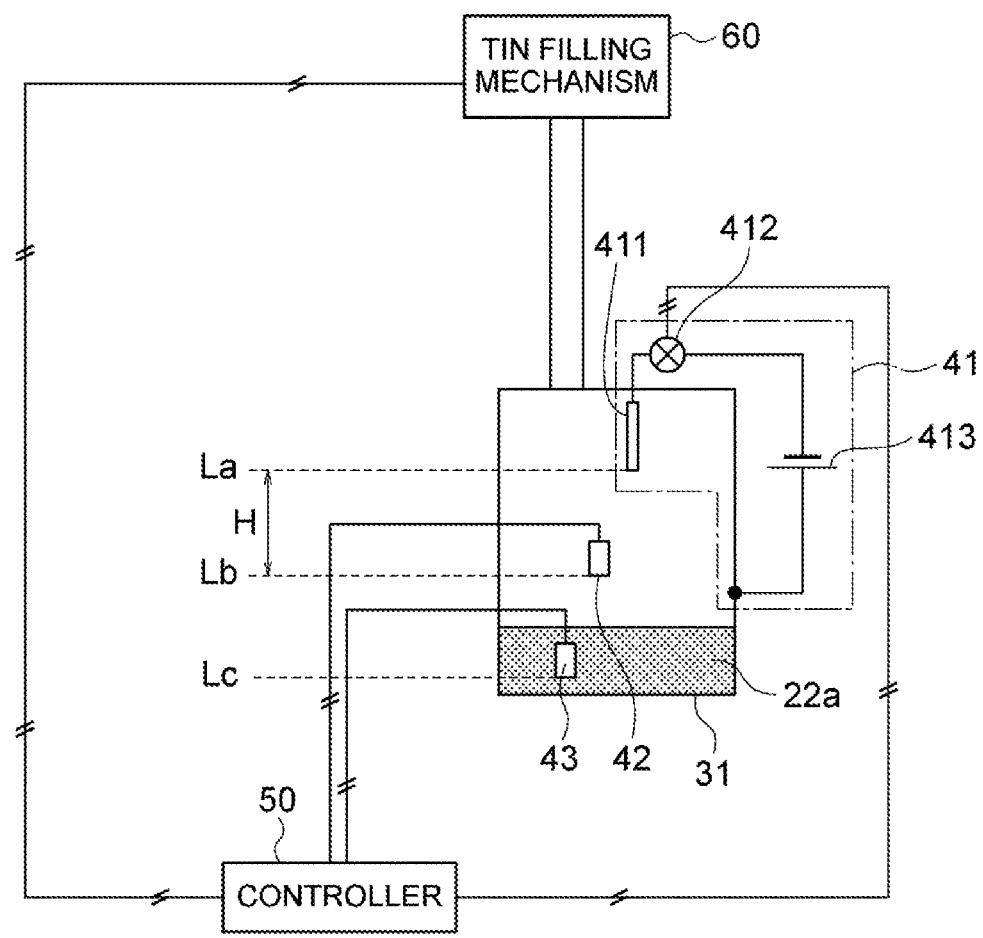
FIG. 3 is a view showing a concrete example of a tin storage mechanism.

FIG. 3 is a view showing a concrete configuration of the tin storage mechanism.

As shown in FIG. 3, the reservoir 31 is provided with three liquid level sensors 41 to 43 which detect a liquid level of the tin contained in the reservoir 31, respectively.

The liquid level sensor 41 is an upper limit level sensor that detects an upper limit level $L_a$ of the tin 22a, the liquid level sensor 42 is a refilling level sensor that detects a refilling level $L_b$ of the tin 22a, and the liquid level sensor 43 is a lower limit level sensor that detects a lower limit level $L_c$ of the tin 22a.

More particularly, the upper limit level sensor 41 is a sensor that detects that the liquid level of the tin 22a in the reservoir 31 is elevated to reach the upper limit level $L_a$. Also, the refilling level sensor 42 is a sensor that detects that the liquid level of the tin 22a in the reservoir 31 is lowered to reach (fall below) the refilling level $L_b$. Furthermore, the lower limit level sensor 43 is a sensor that detects that the liquid level of the tin 22a is further lowered to reach (fall below) the lower limit level $L_c$.

In this case, the upper limit level $L_a$ is set in order to detect an upper limit amount of the tin 22a to be filled in the reservoir 31. In other words, the upper limit level $L_a$ is an upper limit liquid level in which the tin 22a is allowed to be utmost contained in the reservoir 31. When the filled amount of the tin from the tin filling mechanism 60 exceeds the allowable tin storage (containing) amount in the reservoir 31, in some cases an undesired leakage of the tin 22a may occur from the reservoir 31. To come with this, it is preferable to set the upper limit level $L_a$ to keep or take a predetermined margin with respect to the liquid level at which the leakage of the tin 22a occurs.

The refilling level $L_b$ is set in order to detect the timing to start filling the tin 22a from the tin filling mechanism 60 to the reservoir 31. In other words, the refilling level $L_b$ is a liquid level at which the tin 22a is required to be filled in the reservoir 31.

Here, when the reservoir 31 has a pillared shape, where, in an inner volume of the reservoir 31, S denotes a cross sectional area in the height direction (vertical direction in FIG. 3) and H denotes the distance between the upper limit level $L_a$ and the refilling level $L_b$ in the height direction (vertical direction in FIG. 3), then an amount of the tin 22a fillable in the reservoir 31 becomes $V_s=S*H$, during the time from when the liquid level of the tin 22a is at the refilling level $L_b$ until the liquid level of the tin 22a reaches the upper limit level $L_a$. This filling amount $V_s$ is referred to as a referential filling amount (referential supply amount) to be filled from the tin filling mechanism 60 in the reservoir 31.

On the other hand, the lower limit level $L_c$ is set in order to detect that the amount of the tin 22a contained in the reservoir 31 is reduced down to the lower limit amount, which may obstruct or hinder an operation of the EVU light source device 100. In other words, the lower limit level $L_c$ is a liquid level at which the tin 22a is required to be contained at minimum in the reservoir 31. When the amount of the tin 22a falls below the lower limit amount, the pump 35 as shown in FIG. 2 is become difficult to circulatingly supply the tin 22a from the reservoir 31 to the container 23a. Thus, as a result, the laser light is radiated, the discharge occurs and the discharge electrode 21a is worn without the tin 22a being supplied to the discharge region. Thus, it entails a deficiency in which the debris derived from the electrodes increases.

As described above, in the reservoir 31, the upper limit level $L_a$, the refilling level $L_b$, and the lower limit level $L_c$ is in turn set from the upper side in the vertical direction. It should be noted that the lower limit level $L_c$ is assumed not to be detected as long as the refilling level $L_b$ is normally detected and the tin 22a is normally filled in the reservoir 31.

The upper limit level sensor 41 is a sensor that has relatively fast sensor responsiveness. According to the present embodiment, a liquid level sensor of an electrode type that electrically detects the liquid level of the tin 22a is employed. More particularly, the upper limit level sensor 41 is provided with a sensing unit 411, which is constituted to include a metal member of a rod shape (electrode rod), a detection unit (ammeter) 412, and a battery 413.

The sensing unit 411 is disposed in the reservoir 31 such that the longitudinal direction thereof coincides with the vertical direction (vertical direction in FIG. 3). At this moment, the sensing unit 411 is disposed such that a lower end portion thereof (sensing end portion) is positioned at the upper limit level $L_a$ of the tin 22a. An upper end portion of the sensing unit 411 (that is, an end portion opposite to the sensing end portion) is connected to one end of the battery 413 through the ammeter 412.

Also, the other end portion of the battery 413 is connected to an outer wall surface of the reservoir 31 made of the conductive material.

As the tin 22a and the reservoir 31 are both electrically conductive, when a liquid surface of the tin 22a contained in the reservoir 31 contacts the sensing unit 411, which is arranged at a position corresponding to the upper limit level $L_a$, a conductive circuit, which is constituted with the sensing unit 411, the tin 22a, the reservoir 31, and the battery 413, is electrically connected, and it is immediately detected that the above mentioned circuit is a closed circuit (in other words, the current is flowing) by the ammeter 412. On the other hand, when the liquid level of the tin 22a falls below the lower end portion of the sensing unit 411, the above mentioned conductive circuit becomes an open circuit and the ammeter 412 detects that the current is zero.

The ammeter 412 outputs the detected current value to the controller 50. The controller 50 determines whether the liquid level of the tin 22a reaches the upper limit level $L_a$ based on the current value input from the ammeter 412.

Figure 4:
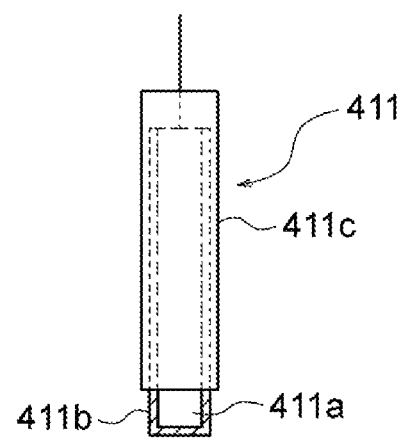
FIG. 4 is a view showing an exemplary configuration of a metal rod.

Here, the sensing unit 411 is provided with, as shown in FIG. 4, a metal rod 411a made of the conductive material. The metal rod 411a may be, for example, made of stainless steel. A surface of the metal rod 411a is applied with a coating 411b that is made of a conductive material inert with respect to the tin 22a. The coating 411b may be, for example, a titanium nitride (TiN) coating.

Also, the sensing unit 411 is provided with a tubular member 411c into which the metal rod 411a, to which a TiN coating 411b is applied, is inserted. Here, the tubular member 411c is made of a material having an appropriate anticorrosion property and also an electrically insulating property to the tin 22a. The tubular member 411c may be made of, for example, aluminum oxide ($Al_2O_3$). The metal rod 411a is inserted into the $Al_2O_3$ tube 411c such that a front edge portion thereof is exposed from the $Al_2O_3$ tube 411c toward the liquid surface of the tin 22a.

It should be noted that, although in the above a certain case in which the TiN coating 411b is applied to the metal rod 411a made of the stainless steel, alternatively, the metal rod 411a itself may be formed by a conductive material inert with respect to the tin 22a. In this case, as the material of the metal rod 411a, for example, tungsten or molybdenum may be employed.

The refilling level sensor 42 and the upper limit level sensor 43 are sensors that have relatively higher detectability of the liquid level (in other words, detection accuracy or detection reliability), respectively. According to the present embodiment, a temperature sensor that is capable of detecting the temperature of the tin 22a in a liquid state is employed. The refilling level sensor 42 and the lower limit level sensor 43 are arranged such that the sensing units thereof are positioned at the refilling level $L_b$ and the lower limit level $L_c$ of the tin 22a, respectively.

Then, the refilling level sensor 42 and the lower limit level sensor 43 output the detected temperature values to the controller 50, respectively. The controller 50 determines whether the liquid level of the tin 22a reaches the refilling level $L_b$ or the lower limit level $L_c$ based of the detected temperature input from the sensors 42 and 43.

When the liquid level of the tin 22a is above the refilling level $L_b$ or the lower limit level $L_c$, then the refilling level sensor 42 or the lower limit level sensor 43 becomes in a state being immersed in the tin 22a in the liquid state. For this reason, in this case, the refilling level sensor 42 and the lower limit level sensor 43 both serving as temperature sensors detect the temperature equal to or greater than the melting point of the tin 22a (approximately 232 degrees Celsius), respectively. In other words, when the detected temperature by the sensor is equal to or greater than the melting point of the tin 22a, the controller 50 is capable of determining that the liquid level of the tin 22a is above the refilling level $L_b$ or the lower limit level $L_c$.

On the other hand, when the liquid level of the tin 22a falls below the refilling level $L_b$ or the lower limit level $L_c$, then the refilling level sensor 42 or the lower limit level sensor 43 becomes in a state being exposed from the tin 22a in the liquid state in the reservoir 31 (that is, a state in which the sensing unit of the temperature sensor is contactless with the tin 22a), respectively. For this reason, in this case, the refilling level sensor 42 or the lower limit level sensor 43, each serving as the temperature sensor, is assumed to measure an atmospheric or ambient temperature in a space above the liquid surface of the tin 22a in the reservoir 31. As the ambient temperature is lower than the melting point of the tin 22a, the detected temperature by the refilling level sensor 42 or the lower limit level sensor 43 is lower (lowered) as compared to the state in which each of the respective sensors 42 and 43 is immersed in the tin 22a. In other words, when the detected temperature by the refilling level sensor 42 or the lower limit level sensor 43 is lowered, then the controller 50 is capable of determining that the liquid level of the tin 22a is lowered to be below the refilling level $L_b$ or the lower limit level $L_c$.

Each of the refilling level sensor 42 and the lower limit level sensor 43 is constituted with, for example, sheathed resistance thermometer, and surface thereof is sheathed with a sleeve made of material inert with respect to the tin 22a. With this configuration, it makes it possible to prevent the chemical reaction from occurring between a sheath (for example, sheath made of stainless steel) and the tin 22a. This is because, when the chemical reaction occurs, the sheath is corroded and the sensor or a cable portion inside the sheath is inevitably exposed, and as a result, it becomes difficult to correctly measure the tin temperature (that is, the liquid level of the tin).

The material of the above mentioned sleeve is preferably material having an anti-corrosion property to the tin 22a, for example, titanium oxide (TiN), tin oxide ($SnO_2$), aluminum oxide ($Al_2O_3$), diamond, tungsten, or molybdenum or the like. It should be noted that, instead of the surface of the sensor being sheathed with the sleeve, the surface of the sensor may be constituted with material having the anti-corrosion property to the tin 22a.

The controller 50 detects the containing amount (storage amount) of the tin 22a in the reservoir 31 based on a detection signals from the upper limit level sensor 41, the refilling level sensor 42 and the lower limit level sensor 43, and performs the filling control such that the containing amount (storage amount) is kept in an appropriate amount (here, the liquid level to be between the refilling level $L_b$ and the upper limit level $L_a$). During the filling control, the controller 50 drive controls the tin filling mechanism 60 to fill the reservoir 31 with the tin 22a from the tin filling mechanism 60.

According to the liquid level sensors 41 to 43 and the controller 50, it makes it possible to constitute the liquid level detection device that is capable of detecting the liquid level of the tin 22a in the liquid state contained in the reservoir 31.

Figure 5:
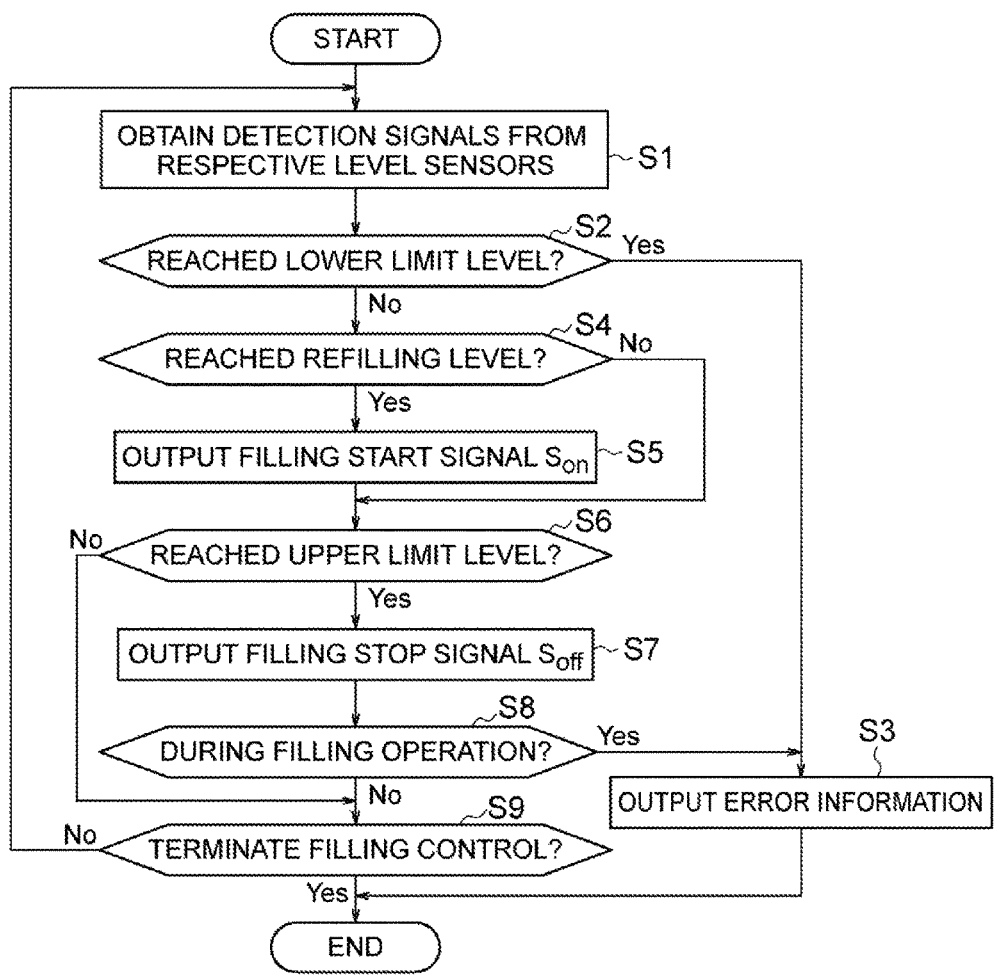
FIG. 5 is a flowchart showing a filling control process performed by a controller according to a first embodiment of the present invention.

FIG. 5 is a flowchart showing a procedure of the filling control process performed by the controller 50.

The filling control process starts at a timing of, for example, a start of driving the EUV light source device 100, and is repetitively performed at a predetermined interval. Nevertheless, it should be noted that the timing to start the above mentioned filling control process is not limited to the above mentioned timing.

First, in step S1, the controller 50 obtains detection signals from the upper limit level sensor 41, the refilling level sensor 42, and the lower limit level sensor 43, respectively, and proceeds to step S2.

In step S2, the controller 50 determines whether the liquid level of the tin 22a in the reservoir 31 is lowered to reach the lower limit level $L_c$. At this moment, the controller 50 determines whether the temperature detected by the lower limit level sensor 43 is below the threshold temperature preset in advance.

More particularly, the controller 50 constantly obtains a moving average value of the detected temperature by the lower limit level sensor 43, and determines that the liquid level of the tin 22a reaches the lower limit level $L_c$ when the controller 50 confirms that the moving average value has been below the above mentioned threshold temperature for a predetermined time (for example, 10 to 20 minutes). In this case, the above mentioned threshold temperature is set to be equal to 232 degrees Celsius, which is the melting point of the tin 22a, or the temperature slightly above the melting point (for example, 250 degrees Celsius).

It should be noted that, for the above mentioned threshold temperature, a certain margin, in which the delay time in the sensor response is taken into consideration, may be added to the setting of the lower limit level sensor 43.

Subsequently, in this step S2, when it is determined that the liquid level reaches the lower limit level $L_c$, the controller 50 proceeds to step S3, while when it is determined that the liquid level does not reach the lower limit level $L_c$, the controller 50 proceeds to step S4, which will be described later.

In step S3, the controller 50 outputs an error signal to, for example, an outside alarm device and stops driving the EUV light source device 100 (that is, the supply of the tin 22a by the pump 35 from the reservoir 31 to the container 32a) to terminate the filling control. At this moment, the alarm device notifies an operator of the occurrence of the error by outputting the alarm or lighting up a warning light or the like.

It should be noted that, in this step S3, the controller 50 may transmit the error signal to a superior controller, which is not shown. In this case, the superior controller actuates the alarm device or controls to drive the EUV light source device 100.

In step S4, the controller 50 determines whether the liquid level of the tin 22a in the reservoir 31 is lowered to reach the refilling level $L_b$. At this moment, the controller 50 determines whether the temperature detected by the refilling level sensor 42 falls below the threshold temperature preset in advance.

More particularly, the controller 50, similarly to the above mentioned process in the step S2, constantly obtains the moving average value of the detected temperature by the refilling level sensor 43, and determines that the liquid level of the tin 22a reaches the refilling level $L_b$ when it is confirmed that the moving average value has been below the above mentioned threshold temperature for a predetermined time (for example, 10 to 20 minutes). Here, the above mentioned threshold temperature is set to be equivalent to 232 degrees Celsius, which is the melting point of the tin 22a, or alternatively the temperature slightly above the melting point (for example, 250 degrees Celsius).

Subsequently, in the step S4, when it is determined that the liquid level reaches the refilling level $L_b$, the controller 50 proceeds to step S5, while when it is determined that the liquid level does not reach the refilling level $L_b$, the controller 50 proceeds to step S6.

In step S5, the controller 50 outputs a filling start signal $S_{on}$, which is to start filling the tin 22a from the tin filling mechanism 60 to the reservoir 31, to the tin filling mechanism 60, and then proceeds to step S6. At this moment, the tin filling mechanism 60, which has received the filling start signal $S_{on}$, fills the reservoir 31 with the tin 22a at a predetermined filling speed.

In step S6, the controller 50 determines whether the liquid level of the tin 22a in the reservoir 31 is elevated to reach the upper limit level $L_a$. More particularly, the controller 50 determines whether the conductive circuit, which is constituted with the sensing unit 411, the tin 22a, the reservoir 31, and the battery 413, has transitioned from the open circuit to the closed circuit (that is, whether the current starts to flow from a state that the current is not flowing) based on the current value detected by the ammeter 412, which constitutes the upper limit level sensor 41. Then, the controller 50 determines that the liquid level of the tin 22a reaches the upper limit level $L_a$ when it is confirmed that the above mentioned conductive circuit has transitioned to the closed circuit.

In this step S6, when the liquid level is determined to reach the upper limit level $L_a$, the controller 50 proceeds to step S7, while when the liquid level is determined not to reach the upper limit level $L_a$, the controller 50 proceeds to step S9, which will be described later.

In step S7, the controller 50 output a filing stop signal $S_{off}$ to the tin filling mechanism 60, and then proceeds to step S8.

In step S8, the controller 50 determines whether the tin filling mechanism 60 is being during the filling operation to the reservoir 31, in other words, whether the tin filling mechanism 60, which has received the filling stop signal $S_{off}$ output from the controller 50, has stopped filling the tin 22a to the reservoir 31. Then, when the controller 50 monitors a filling operation detection mechanism, which will be described later, provided at the tin filling mechanism 60 and detects the filling of the tin is being stopped (in the case of No in step S8), the controller 50 proceeds to step S9.

On the other hand, in the above mentioned step S8, when the controller 50 monitors the filling operation detection mechanism of the tin filling mechanism 60 and detects that the filling of the tin is still continuing (in the case of Yes in step S8), the controller 50 proceeds to step S3.

In step S9, the controller 50 determines whether to terminate the filling control. For example, the controller 50 may determine to terminate the filling control when a driving stop button of the EUV light source device 100 is pushed by an operator. In this step S9, when the controller 50 determines not to terminate the filling control, then the controller 50 proceeds to the above mentioned step S1.

Hereinafter, an operation according to the first embodiment will be described in detail.

Here, a certain case will be described in which the reservoir 31 is filled with a necessary and sufficient amount of the tin 22a in a liquid state and, as shown in FIG. 2, an EUV radiation is continuously performed by the EUV light source device 100 in a state in which the tin 22a is supplied circulatingly from the reservoir 31 to the container 32a.

In this case, the raw material (tin 22a) is gradually consumed, and the tin 22a in the circulating passage or line shown in FIG. 2 decreases. In other words, the storage amount of the tin 22a in the reservoir 31 gradually decreases.

In this way, when the tin 22a in the reservoir 31 is reduced from a state in which the liquid level of the tin 22a in the reservoir 31 is at an appropriate level (that is, a level between the refilling level $L_b$ and the upper limit level $L_a$), and the liquid level of the tin 22a falls below the refilling level $L_b$, then the refilling level sensor 42 serving as the temperature sensor becomes contactless with the liquid level of the tin 22a. Subsequently, the detected temperature by the refilling level sensor 42 is lowered as compared to when the liquid level of the tin 22a is above the refilling level $L_b$, and the controller 50 determines that the liquid level of the tin 22a reaches the refilling level $L_b$ based on the change in temperature (Yes in step S4).

At this moment, the controller 50 transmits the filling start signal $S_{on}$ to the tin filling mechanism 60 (step S5), and the tin filling mechanism 60, which has received the filling start signal $S_{on}$, starts to supply the tin 22a to the reservoir 31. As a result, the liquid level of the tin 22a in the reservoir 31 is elevated.

Subsequently, when the liquid level of the tin 22a in the reservoir 31 reaches the upper limit level $L_a$, then the sensing unit 411 of the upper limit level sensor 41 (that is, the metal rod 411a) contacts the liquid surface of the tin 22a. Then, the ammeter 412 of the upper limit level sensor 41 detects the current value, and the controller 50 determines that the liquid level of the tin 22a reaches the upper limit level $L_a$ by confirming the current value (Yes in step S6).

The controller 50 transmits the filling stop signal $S_{off}$ to the tin filling mechanism 60 when the liquid level is determined to reach the upper limit level $L_a$ (step S7). The tin filling mechanism 60, which has received the filling stop signal $S_{off}$, stops supplying the tin 22a to the reservoir 31. As a result, the increase in the liquid level of the tin 22a in the reservoir 31 is stopped when the liquid level reaches the upper limit level $L_a$.

According to the above mentioned processes, the liquid level of the tin 22a in the reservoir 31 is controlled to be at an appropriate level.

Assuming that, supposedly, a deficiency would occur in the refilling level sensor 42 during the operation of the EUV light source device 100, even when the liquid level of the tin 22a falls below the refilling level $L_b$, the refilling level sensor 42 fails to detect it. Thus, the controller 50 also fails to transmit the filling start signal $S_{on}$ to the tin filling mechanism 60. In other words, the filling of the tin 22a fails to be performed to the reservoir 31 from the tin filling mechanism 60. As a result, the liquid level is still subsequently and gradually lowered to reach the lower limit level $L_c$.

Then, when the liquid level of the tin 22a falls below the lower limit level $L_c$, the lower limit level sensor 43, which serves as a temperature sensor, becomes contactless with the liquid level of the tin 22a. Then subsequently, the detected temperature by the lower limit level sensor 43 is lowered as compared to when the liquid level of the tin 22a stays above the lower limit level $L_c$, and the controller 50 determines that the liquid level of the tin 22a reaches the lower limit level $L_c$ based on the change in temperature (Yes in step S2).

At this moment, the controller 50 outputs an error signal to notify the operator of the occurrence of the error. In this way, the controller 50 prompts the operator to confirm the status or condition of the refilling level sensor 42.

It should be noted that, according to the present embodiment, although a certain case is described in which the alarm is output or the warning light is lit up at the time of the error occurring, the content of the error may be displayed on a display device. More particularly, for example, two cases would be conceivable when the liquid level of the tin 22a reaches the lower limit level $L_c$ as described above, namely, one case in which the controller 50 fails to detect that the liquid level of the tin 22a reaches the refilling level $L_b$ due to a deficiency occurred in the refilling level sensor 42, and the other case in which the tin filling mechanism 60 fails to start filling due to a deficiency occurred in the tin filling mechanism 60 although the controller 50 has correctly detected that the liquid level of the tin 22a reaches the refilling level $L_b$ and sent the filling start signal $S_{on}$ to the tin filling mechanism 60.

Accordingly, in those cases, an error information is displayed which indicates that the deficiency is occurring in the filling level sensor 42 or in the tin filling mechanism 60. More particularly, in those cases, the deficiency can be determined to be in the refilling level sensor 42 if the controller 50 does not output the filling start signal $S_{on}$ to the tin filling mechanism 60, otherwise the deficiency can be determined to be in the tin filling mechanism 60 if the controller 50 outputs the filling start signal $S_{on}$. Thus, the content of the error information to be displayed may be changed depending on the presence or absence of an output of the filling start signal $S_{on}$. In this way, by presenting the error information to indicating the content of the error, it makes it possible for the operator to facilitate the confirmation work to locate the defect portion.

As described above, according to the present embodiment, the reservoir 31, which supplies the tin 22a serving as the high temperature plasma raw material to the container 23a, is provided with liquid level sensors, each of which detects the liquid level of the tin 22a in the reservoir 31. More particularly, as the liquid level sensors, the reservoir 31 is provided with the upper limit level sensor 41 detecting the liquid level being elevated from the downside, and the refilling level sensor 42 and the lower limit level sensor 43 each of which detects the liquid level being lowered from the upper side.

Then, the upper limit level sensor 41 is configured to be a sensor having a faster response speed than the refilling level sensor 42 and the lower limit level sensor 43. On the other hand, the refilling level sensor 42 and the lower limit level sensor 43 are each configured to be a sensor having a higher detectability (detection accuracy) than the upper limit level sensor 41.

More particularly, the upper limit level sensor 41 is configured to be a liquid level sensor of the electrode type that electrically detects the liquid level. On the other hand, the refilling level sensor 42 and the lower limit level sensor 43 each configured to be a temperature sensor that detects the liquid level based on the change in temperature.

When tin 22a is filled to the reservoir 31 from the tin filing mechanism 60 and the filled amount of the tin from the tin filling mechanism 60 exceeds the allowable containing (storage) amount of the tin in the reservoir 31, then the undesired leakage of the tin 22a inevitably occurs from the reservoir 31. To cope with this, it is required to promptly detect a status in which the liquid level of the tin 22a reaches the upper limit level $L_a$.

According to the present embodiment, as the upper limit level sensor 41 for detecting that the liquid level of the tin 22a reaches the upper limit level $L_a$, a sensor having a higher response speed that detects the liquid level, for example, electrically. For this reason, it makes it possible to prevent the deficiencies from occurring in which, for example, the timing for detecting is delayed that the liquid level reaches the upper limit level $L_a$ or an undesired leakage of the tin 22a occurs from the reservoir 31.

In the meantime, films of impurities, which are electrically conductive, increasingly float on the liquid surface of the tin contained in the reservoir 31. When the reservoir 31 has a configuration into which the solid tin is to be refilled from the tin filling mechanism 60, the impurities may include a tin oxide film which covers the surface of the solid tin, a reactant in which the tin reacts with a part of metal constituting the reservoir 31 or the discharge electrode 21a, or a compound in which the tin is combined with a residual gas in the vacuum atmosphere. Those impurities are gradually generated, and floats in a form of a conductive film on the liquid surface of the tin 22a contained in the reservoir 31. As most of those impurities have a specific gravity lighter than the liquid tin, the impurity film floats on the liquid surface of the liquid tin.

Figure 11:
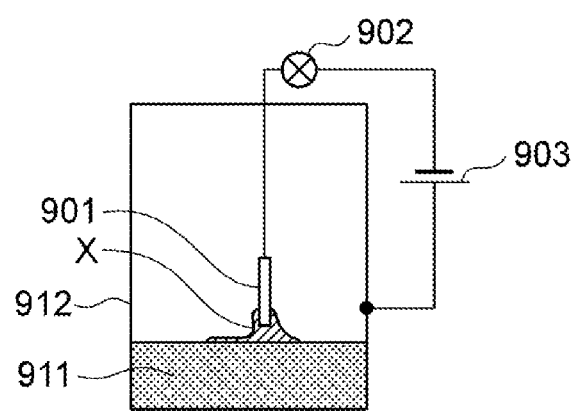
FIG. 11 is a view illustrating a possible situation that may occur when a conventional liquid level sensor is employed.

As shown in FIG. 11, when a part of those impurity film X clings damply around the metal rod 901, then the impurity film X electrically connects the metal rod 901 to the liquid surface of the tin 911 in a state that the liquid level of the tin 911 is being below the sensing level. As the impurity film X is electrically conductive, as a result, the impurity film X electrically short circuits the front edge of the metal rod 901 to the liquid level of the tin 911 so that it is erroneously detected that the liquid level of the tin 911 reaches the sensing level.

In this regard, according to the present embodiment, the metal rod 411a, which serves as the sensing unit of the upper limit level sensor 41, is kept contactless with the liquid surface of the tin 22a unless the liquid level of the tin 22a filled in the reservoir 31 reaches the upper limit level $L_a$. For this reason, the deficiency hardly occurs in which a part of the impurity films appeared on the liquid surface of the tin 22a clings damply around the metal rod 411a. In other words, the erroneous detection hardly occurs even when the above mentioned sensor that electrically detects the liquid level is employed as the upper limit level sensor 41 for detecting that the liquid level is elevated to reach the upper limit level.

Assuming that, supposedly, the impurities cling damply around the metal rod 411a of the upper limit level sensor 41 and the liquid level of the tin 22a is erroneously detected to reach the upper limit level $L_a$ before the liquid level of the tin 22a actually reaches the upper limit level $L_a$, still it does not entail a big problem. This is because the deficiencies can be avoided in which an amount of the tin filled from the tin filling mechanism 60 exceeds the allowable storage amount of the tin in the reservoir 31 and an undesired leakage of the tin occurs from the reservoir 31 (in other words, it is controlled to the secure side).

Also, according to the present embodiment, the sensing unit 411 of the upper limit level sensor 41 is configured such that the metal rod 411a onto which the TiN coating 411b is applied is inserted into the $Al_2O_3$ tube 411c, as shown in FIG. 4.

In this way, as the TiN coating 411b is applied onto the surface of the metal rod 411a, it makes it possible to prevent the chemical reaction between the metal rod 411a and the tin 22a from occurring and precisely measure the liquid level of the tin 22a. Once the chemical reaction occurs, the metal rod 411a is corroded and damaged so as to make it impossible correctly measure the liquid level. For example, when the metal rod 411a is made of the stainless rod, the surface of the stainless rod is corroded by the tin (Sn) so as to form the iron compounds such as SnFe or $SnFe_2$ or the like on the surface thereof without the TiN coating 411b being applied to the surface thereof. As those compounds have a higher wettability to the impurities (that is, a slag) floating on the liquid surface of the tin 11a, the impurities are likely to cling damply around the metal rod 411a so as to entail the deficiency in which the liquid level of the tin 22a fails to be precisely measured.

Yet furthermore, according to the present embodiment, the metal rod 411a onto which the TiN coating 411b is applied is inserted into the $Al_2O_3$ tube 411c. As $Al_2O_3$ is material having relatively higher water repellency (water shedding property), the above mentioned impurities is unlikely to adhere to the $Al_2O_3$ tube 411c. As shown in FIG. 4, the most parts of the sensing unit 411 are occupied with the $Al_2O_3$ tube 411c, it makes it possible to effectively prevent the impurities from clinging damply around the metal rod 411a. In addition, as $Al_2O_3$ has the electrically conductive property, even when, supposedly, the conductive impurities (slag) are adhered to the portion thereof, it can avoid the electrical detection. As a result, even when the impurities cling damply around the sensing unit 411, still it makes it possible to reduce the probability of the erroneous detection of the liquid level of the tin 22a.

Figure 6:
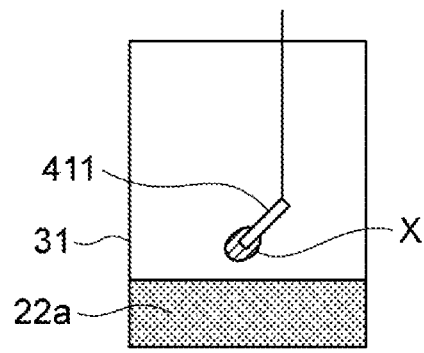
FIG. 6 is a view showing the metal rod being arranged to be inclined with respect to the liquid surface.
Figure 7:
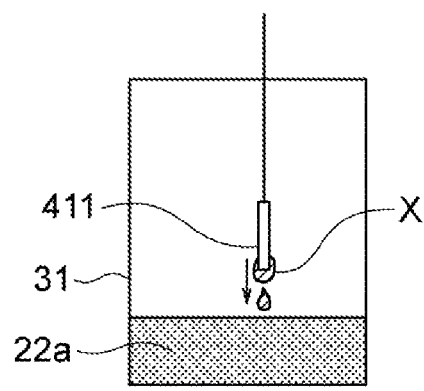
FIG. 7 is a view showing the metal rod being arranged to be vertical to the liquid surface.

Yet furthermore, the sensing unit 411 is arranged such that the longitudinal direction thereof coincides with or substantially coincides with the vertical direction (gravity direction) with respect to the liquid surface of the tin 22a. Assuming that, supposedly as shown in FIG. 6, the sensing unit 411 is arranged such that the longitudinal direction thereof is inclined with respect to the liquid surface of the tin 22a, the impurity film X is likely to cling damply to the sensing unit 411. In contrast, according to the present embodiment, as the sensing unit 411 is arranged such that the longitudinal direction thereof is vertical with respect to the liquid surface of the tin 22a, as shown in FIG. 7, the impurity film X adhered to the sensing unit 411 is likely to be abscised from the sensing unit 411 by the gravity.

On the other hand, the refilling level sensor 42 and the lower limit level sensor 43, both of which detect the liquid level being lowered from the upper side, become in a state to be constantly immersed in the tin 22a in the liquid state in the reservoir 31, respectively, as long as the tin is normally being supplied circulatingly to the container 23a from the reservoir 31.

For this reason, when the liquid level of the tin 22a reaches the refilling level $L_b$ or the lower limit level $L_c$, it is highly probable that the electrically conductive impurity film, which floats on the liquid surface of the tin 22a, is adhered to the surface of the refilling level sensor 42 or the lower limit level sensor 43.

Thus, when employing, similarly to the upper limit level sensor 41, a sensor that electrically detects the liquid level of the tin 22a by using the metal rod as the refilling level sensor 42 or the lower limit level sensor 43, it is highly probable that the deficiency occurs in which, for example, the timing would be delayed to detect that the liquid level of the tin 22a falls below the refilling level $L_b$ or the lower limit level $L_c$.

To cope with this, according to the present embodiment, the temperature sensor that detects the liquid level based on the change in temperature is employed as the refilling level sensor 42 and the lower limit level sensor 43 both of which detect the liquid level being lowered from the upper side.

When the liquid level falls below the refilling level $L_b$ or the lower limit level $L_c$, the impurity film clings damply to the refilling level sensor 42 or the lower limit level sensor 43, respectively. However, even when the adhered film is connected to the liquid surface of the tin 22a, still the sensing unit of the refilling level sensor 42 or the lower limit level sensor 43 is exposed from the tin 22a in the liquid state. Also, the amount of the adhered impurities, which adversely affects the measurement of the temperature of the respective sensors, is small and the heat capacity thereof is also small. As a result, the detected temperature by respective sensors is still lower than the melting point of the tin 22a. In other words, even when the impurity film is adhered to the refilling level sensor 42 or the lower limit level sensor 43, still it makes it possible to detect the decrease in temperature of the detected temperature of the refilling level sensor 42 or the lower limit level sensor 43. Accordingly, it makes it possible to detect that the liquid level of the tin 22a falls below the refilling level $L_b$ or the lower limit level $L_c$.

As described above, the liquid level sensor employing the temperature sensor is capable of detecting the liquid level with the higher accuracy without being affected by the impurity film.

It should be noted that the temperature sensor has a lower responsiveness as compared to another sensor mechanism that electrically detects the liquid level. However, even when the detection of the timing in which the liquid level of the tin 22a reaches the refilling level $L_b$ by the delay time in the sensor response, the tin 22a is still normally supplied circulatingly from the reservoir 31 to the container 23a, because the liquid level of the tin 22a is still above the lower limit level $L_c$.

As described above, according to the present embodiment, in the reservoir 31 for containing the molten tin serving as the high temperature plasma raw material, it makes it possible to eliminate the influence of the electrically conductive impurity film floating on the liquid surface of the tin 22a contained in the reservoir 31 and appropriately detect the storage amount (that is, liquid level) of the tin 22a in the reservoir 31. Accordingly, it makes it possible to supply the discharge electrodes of the EUV light source device 100 with the high temperature plasma raw material in a stable manner.

Second Embodiment

Hereinafter, a second embodiment according to the present invention will be described in detail.

The second embodiment is configured to count an amount of the tin actually supplied to the reservoir 31 from the fin filling mechanism 60 (hereinafter referred to as "actually-measured supplied amount" or "actual measured supplied amount"), and to detect an occurrence of the deficiency of the upper limit level sensor 41 or the refilling level sensor 42 based on the result thereof.

A tin storage mechanism according to the second embodiment differs from those of the above mentioned first embodiment in that, in the tin storage mechanism shown in FIG. 3, the tin filling mechanism 60 has a function to count the supplied amount of the tin to the reservoir 31. In addition, the controller 50 according to the second embodiment performs a process different from those by the above mentioned controller 50 according to the first embodiment.

Figure 8:
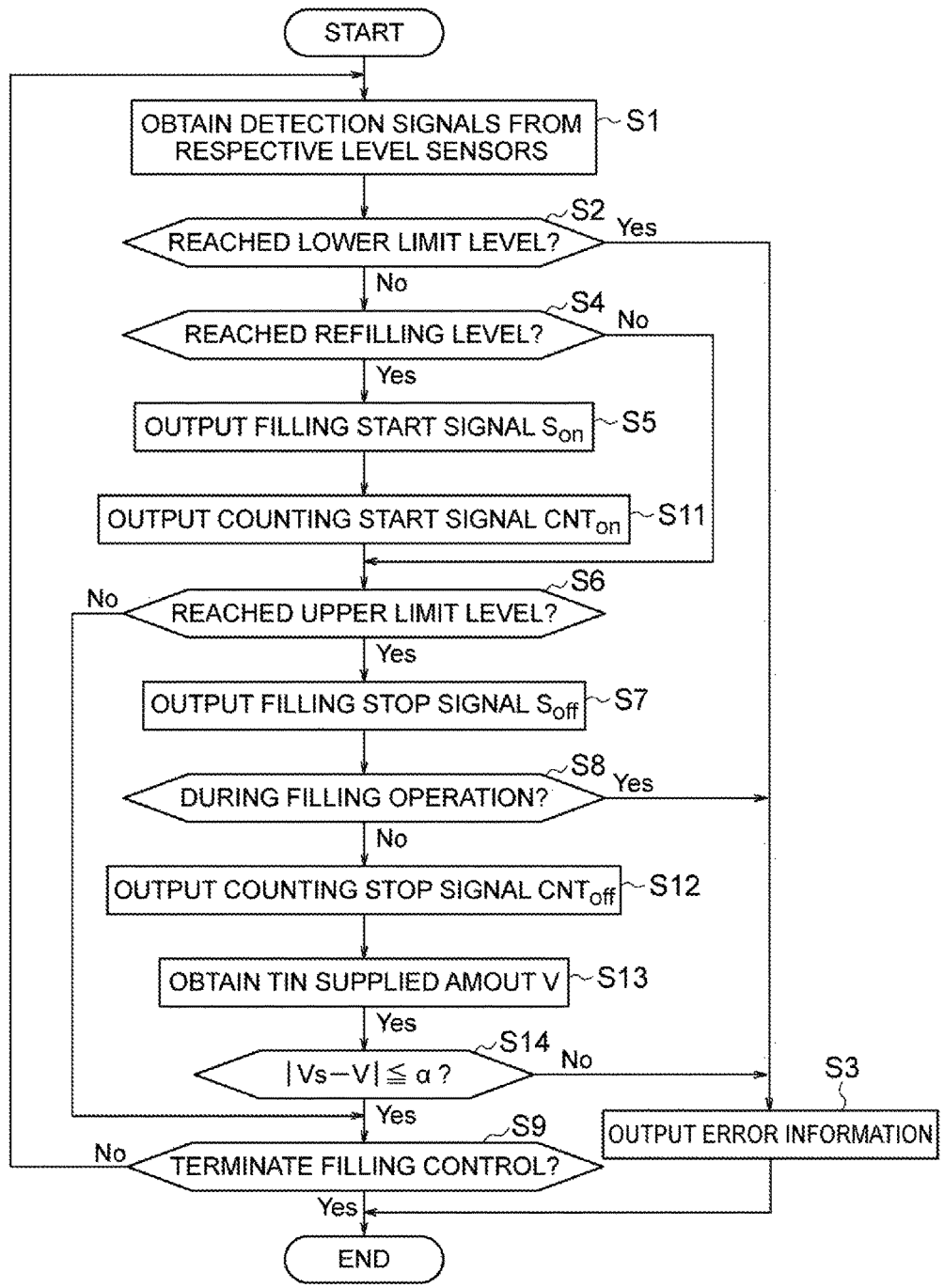
FIG. 8 is a flowchart showing a filling control process performed by a controller according to a second embodiment of the present invention.

FIG. 8 is a flowchart showing a procedure of a filling control process performed by the controller 50 according to the second embodiment. In the filling control process shown in FIG. 8, a part of the process same as the filling control process shown in FIG. 5 is denoted with the same step number, and hereinafter a part of the different process will be mainly described.

In the above mentioned step S5, the controller 50 outputs the filling start signal $S_{on}$ to the tin filling mechanism 60, and subsequently proceeds to step S11.

In step S11, the controller 50 outputs a count start signal $CNT_{on}$, which is to instruct to start counting the supplied amount of the tin to the reservoir 31, to the tin filing mechanism 60, and subsequently proceeds to the above mentioned step S6.

Also, when, in the above mentioned step S8, the controller 50 monitors the filing operation detection mechanism of the tin filling mechanism 60 and detects that the filling of the tin has being stopped, the controller 50 proceeds to step S12.

In step S12, the controller 50 outputs a count stop signal $CNT_{off}$, which instructs to stop counting the supplied amount of the tin to the reservoir 31, to the tin filling mechanism 60 and subsequently proceeds to step S13.

In step 13, the controller 50 obtains the supplied amount (actual measured supplied amount) V of the tin counted during the time from when the tin filling mechanism 60 receives the count start signal $CNT_{on}$ until the tin filling mechanism 60 receives the count stop signal $CNT_{off}$, and subsequently proceeds to step S14.

In step S14, the controller 50 compares the actual measured supplied amount V, which is obtained in step S13, with a referential to-be-supplied amount (supply amount) $V_s$, which is determined based on a shape of the reservoir 31, a position of the upper limit level $L_a$, and a position of the refilling level $L_b$, and determines whether an absolute value of the difference between both $|V_s-V|$ is equal to or less than an allowable variation (dispersion) amount α.

Here, as described above, the referential to-be-supplied amount $V_s$ is an amount of the tin 22a supplied from the tin filling mechanism 60 from when the liquid level in the reservoir 31 is at the refilling level $L_b$ until the liquid level reaches the upper limit level $L_a$, which is $V_s=S*H$, where the reservoir 31 has a pillared shape, a cross sectional area of the reservoir 31 in the height direction (vertical direction in FIG. 3) is S, a distance between the upper limit level $L_a$ and the refilling level $L_b$ in the height direction (vertical direction in FIG. 3) is H. The referential to-be-supplied amount $V_s$ is stored in a memory or the like in advance. Also, the above mentioned allowable variance amount α is set by taking a variance in the filling amount, which occurs due to a variance in a sensing timing by the sensor or a variance in filling by the tin filling mechanism 60, into consideration.

Then, when $|V_s-V| \leq α$, the controller 50 determines that the difference between the actual measured supplied amount V and the referential to-be-supplied amount $V_s$ is within an allowable range, and proceeds to the above mentioned step S9. On the other hand, when $|V_s-V|>α$, the controller 50 determines that the difference between the actual measured supplied amount V and the referential to-be-supplied amount $V_s$ is outside the allowable range, and proceeds to the above mentioned step S3.

Hereinafter, an operation according to the second embodiment will be described in detail below.

It is assumed that both of the upper limit level sensor 41 and the refilling level sensor 42 are in normal operation. In this case, the refilling level sensor 42 correctly detects that the liquid level in the reservoir 31 falls below the refilling level $L_b$. Thus, the controller 50 is capable of appropriately outputting the filling start signal $S_{on}$ to the tin filling mechanism 60 at a timing when the liquid level in the reservoir 31 falls below the refilling level $L_b$.

Also, the upper limit level sensor 41 is capable of correctly detecting that the tin 22a is supplied by the tin filling mechanism 60 and the liquid level in the reservoir 31 reaches the upper limit level $L_a$. Then the controller 50 is capable of appropriately outputting the filling stop signal $S_{off}$ to the tin filling mechanism 60 at a timing when the liquid level in the reservoir 31 reaches the upper limit level $L_a$.

For this reason, in this case, an amount of the tin 22a supplied to the reservoir 31 (actual measured supplied amount) V, during the time from when the tin filling mechanism 60 receives the filling start signal $S_{on}$ until the tin filling mechanism 60 receives the filling stop signal $S_{off}$, coincides with the referential to-be-supplied amount $V_s$. In other words, it becomes $|V_s-V|=0$ (Yes in step S14). As a result, the controller 50 determines that both of the upper limit level sensor 41 and the refilling level sensor 42 are in normal operation and the tin 22a is correctly filled so as to normally terminate the filling.

On the other hand, when the deficiency occurs in at least one of the upper limit level sensor 41 or the refilling level sensor 42 and the timing to detect the liquid level considerably deviates from an appropriate timing, then the timing to transmit the filling start signal $S_{on}$ or the filling stop signal $S_{off}$ to the tin filling mechanism 60 also considerably deviates.

For example, when the deficiency occurs in the refilling level sensor 42 and the timing to detect the refilling level $L_b$ is delayed, then the actual measured supplied amount V exceeds the referential to-be-supplied amount $V_s$. Likewise, when the deficiency occurs in the upper limit level sensor 41 and the timing to detect the upper limit level $L_a$ is delayed, then the actual measured supplied amount V falls below the referential to-be-supplied amount $V_s$. In other words, in any cases, it becomes $|V_s-V|>α$ (Yes in step S14).

As a result, the controller 50 determines that an abnormal event occurs in at least one of the upper limit level sensor 41 and the refilling level sensor 42 and the tin 22a is not correctly filled, and the controller 50 outputs the error signal so as to notify the operator of the occurrence of the error. In this way, the controller 50 prompts the operator to confirm the status of the upper limit level sensor 41.

As described above, by providing the tin filling mechanism 60 with the function to count the supplied amount of the tin to the reservoir 31, the controller 50 is capable of perceiving the amount of the tin 22a that is actually supplied to the reservoir 31 from the tin filling mechanism 60. As a result, when the deficiency occurs in the upper limit level sensor 41 or the refilling level sensor 42, the controller 50 is capable of detecting the deficiency by determining that the difference between the actual measured supplied amount V and the referential to-be-supplied amount $V_s$ exceeds the allowable variance amount α. Accordingly, it makes it possible to effectively prevent the filling control from being erroneously continued by the inappropriate detection signal.

Third Embodiment

Hereinafter, a third embodiment according to the present invention will be described in detail.

The third embodiment is capable of counting the tin supplied amount by the tin filling mechanism 60 in an easier and appropriate manner.

Figure 9:
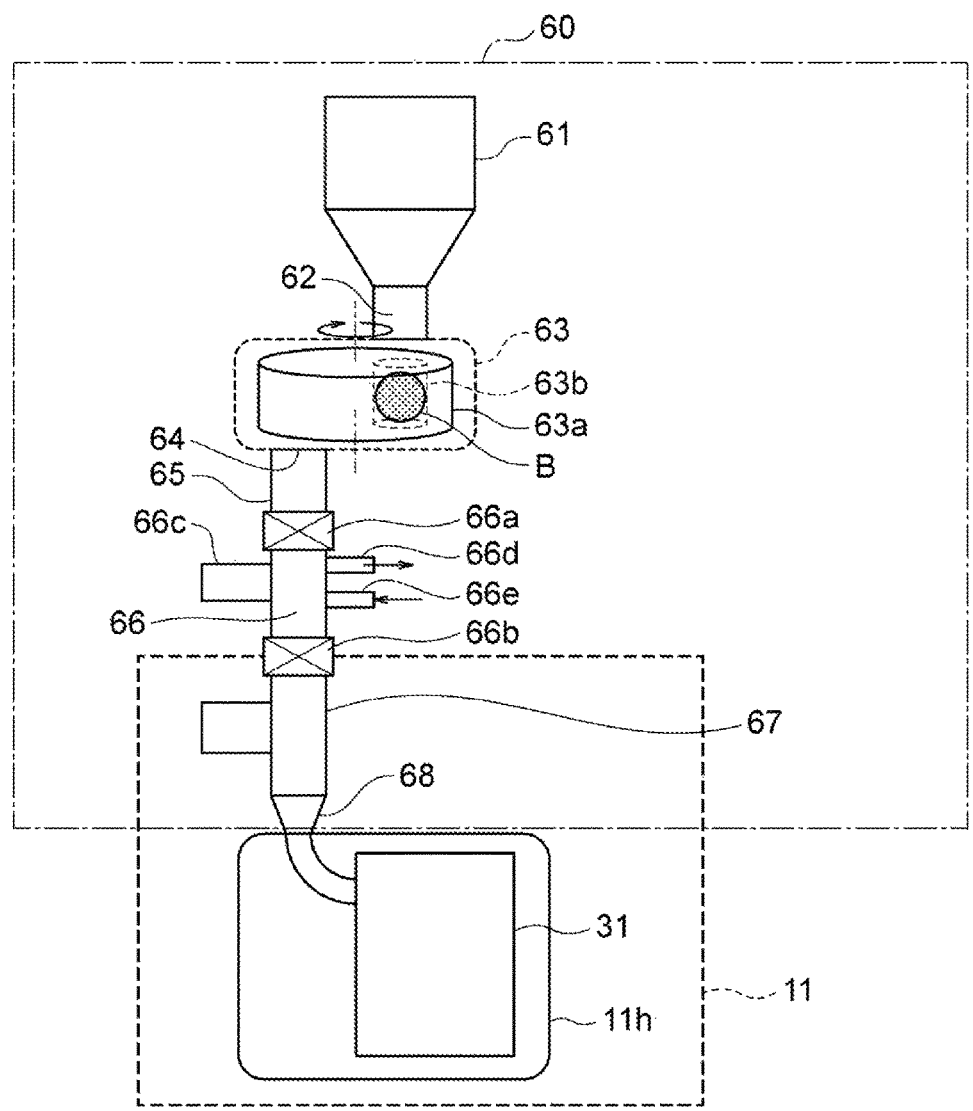
FIG. 9 is a view showing a tin filling mechanism according to a third embodiment of the present invention.

FIG. 9 is a view showing a concrete configuration of the tin filling mechanism 60 according to the third embodiment.

The thin filling mechanism 60 is provided with a tin cartridge storage chamber 61. The tin cartridge storage chamber 61 stores tin raw materials in a solid state. A shape of the solid tin raw material is, for example, a spherical shape. It should be noted that the shape of the solid tin raw material may be alternatively an arbitrary shape such as a rod shape, a spheroidal (ellipsoidal) shape, or other block shapes or the like. The solid tin raw material (hereinafter referred to as "tin ball B") undergoes an acid cleaning in advance and a plurality of tin balls B are stored in the tin cartridge storage chamber 61.

An outlet port 62 for supplying the tin ball B to outside is provided at a bottom portion of the tin cartridge storage chamber 61.

A tin raw material transport mechanism 63 for transporting the tin balls B is arranged at a bottom portion of the outlet port 62. The tin raw material transport mechanism 63 is a tin raw material transport mechanism of a rotating disk type that transports the tin balls B by a rotating disk 63a. At the rotating disk 63a, a transport hole 63b is formed that holds and transports a tin ball individually.

The rotating disk 63a is configured to be rotatably about an axis in the vertical direction (vertical direction in FIG. 9) as a center axis. A tin ball B, which is supplied to the transport hole 63b through the outlet port 62, is transported to the inlet port 64 with the rotating disk 63a being rotated and then supplied to the raw material supply tube 65 from the inlet port 64.

By monitoring the number of rotations (rotating speed) of the rotating disk 63a, it makes it possible to count the number of the tin balls B supplied to the raw material supply tube 65, in other words, the number of tin balls B supplied to the reservoir 31. Also, by controlling the rotating disk 63a based on information of the number of rotations, it makes it possible to control the to-be-supplied amount of the tin balls B.

The raw material supply tube 65 is provided with a load lock portion 66 having a load lock function. The load lock portion 66 is partitioned into a first gate valve 66a and a second gate valve 66b. The partitioned load lock space is provided with a manometer 66c, a pipeline for vacuuming 66d, and a pipeline for supplying a purge gas 66e.

The tin ball B transported by the tin raw material transport mechanism 63 is temporarily supplied to the load lock portion 66 from the inlet port 64 through the raw material supply tube 65. More particularly, the tin ball B is supplied to the load lock portion 66 in which the first gate valve 66a is in an open state and the second gate valve 66b is in a closed state.

The tin raw material transport mechanism 63 stops transporting at a timing when a predetermined amount of tin balls B preset in advance are supplied to the load lock portion 66.

Subsequently, the first gate valve 66a at an upper portion of the load lock portion 66 is closed and the vacuuming of load lock portion 66 starts by the pipeline for vacuuming 66d. Then, after a sufficient vacuuming is obtained in the load lock portion 66, the second gate valve 66b at a lower portion of the load lock portion 66 is opened, and the tin balls B are injected (ejected) into the reservoir 31 through an insulation tube for supplying the tin raw material 67. Here, at an end portion of the insulation tube for supplying the tin raw material 67, a tapered portion 68 having a tapered shape is formed in order to ensure the tin balls B to be supplied to the reservoir 31.

It should be noted that the second gate valve 66b and the insulating tube for supplying the tin raw material 67 are arranged inside the chamber 11 of the EUV light source device 100, which serves as the vacuum vessel, respectively, and coupled to the reservoir 31. As a high voltage portion 11h such as a discharge electrode or the like exists inside the chamber 11 of the EUV light source device 100, the insulating tube for supplying the tin raw material 67 is constituted with a member having an insulating property.

Furthermore, the "pd value", which is a product of a degree of vacuum "p" inside the insulating tube for supplying the tin raw material 67 and a clearance "d" between the high voltage portion and a ground potential portion, is designed such that the "pd value" is positioned at a left side of the Paschen curve. Between the reservoir 31 and the tin filling mechanism 60 is kept insulated.

After the tin balls B are injected into the reservoir 31, the second gate valve 66b at the lower portion of the load lock portion 66 is closed, and inside the load lock portion 66 is purged by a purge gas (for example, an Ar gas) supplied through the pipeline for supplying the purge gas 66e. Subsequently, when the purge of the load lock portion 66 is completed, the first gate valve 66a at the upper portion thereof is opened so as to prepare to start the subsequent filling of the tin balls.

The above mentioned tin filling process is repetitively performed during the time from when receiving the filing start signal $S_{on}$ from the controller 50 until receiving the filling stop signal $S_{off}$, in other words, from when the tin liquid level in the reservoir 31 falls below the refilling level $L_b$ until the tin liquid level reaches the upper limit level $L_a$.

In this way, by providing the tin filling mechanism 60 with the rotating disk 63 of a revolver type, it makes it possible to count the supplied amount of the tin to the reservoir 31 in an easier and appropriate manner.

For example, as the above mentioned second embodiment, when the controller 50 transmits the count start signal $CNT_{on}$ or the count stop signal $CNT_{off}$, the tin filling mechanism 60 starts or stops counting the supplied amount of the tin, respectively, at the timing when receiving the signal. Then, the tin filling mechanism 60 may transmit the actual measured supplied amount V to the controller 50, which is supplied to the reservoir 31 during the time from when receiving the count starting signal $CNT_{on}$ until receiving the count stop signal $CNT_{off}$.

In addition, it is also possible to use the above mentioned manometer 66c as a mechanism for detecting the filling operation of the tin filling mechanism 60.

In step S7 in FIG. 5, the tin filling mechanism 60, when receiving the filling stop signal $S_{off}$ output from the controller 50, stops injecting the tin balls B into the reservoir 31 and closes the second gate valve 66b at the lower portion of the load lock portion 66. Subsequently, the tin filling mechanism 60 purges inside the load lock portion 66 with the purge gas (for example, the Ar gas) supplied by the pipeline for supplying the purge gas 66e. After then, when the purging of the load lock portion 66 is completed, the tin filling mechanism 60 opens the first gate valve 66a at the upper portion, and prepares starting the next filling of the tin balls to be performed when receiving the next filling start signal $S_{on}$. In other words, when the filling stop signal $S_{off}$ is transmitted from the controller 50, inside the above mentioned load lock portion 66 becomes at an atmospheric pressure. Then, after receiving the subsequent filling start signal $S_{on}$ from the controller 50, the load lock portion 66 is kept in the vacuum state when injecting the tin balls B into the reservoir 31.

On the other hand, it is assumed that an error occurs in which the tin filling mechanism 60 fails to stop injecting the tin balls B into the reservoir 31 although the tin filling mechanism 60 has received the filling stop signal $S_{off}$ output from the controller 50 (that is, "Yes" in the step S8 in FIG. 5). In this case, the tin filling mechanism 60 continues injecting the tin balls B into the reservoir 31 even after receiving the filling stop signal $S_{off}$. In other words, in order to continue the injection of the tin balls B, the tin filling mechanism 60 repeats to set inside the load lock portion 66 to be in the purged state and in the vacuum state alternately even after receiving the filling stop signal $S_{off}$.

To sum up the above, when the tin filling mechanism 60 is in a normal operation (that is, "No" in the step S8 in FIG. 5), the pressure in the load lock portion 66 becomes at the atmospheric pressure after receiving the filling stop signal $S_{off}$, then subsequently, kept at the atmospheric pressure at least until receiving the subsequent filling start signal $S_{on}$.

On the other hand, when an abnormal operation occurs in which the tin filing mechanism 60 continues the filling operation of the tin even after receiving the filling stop signal $S_{off}$ (that is, "Yes" in the step S8 in FIG. 5), in the tin filling mechanism 60, the filling operation of the tin occurs before receiving the subsequent filling start signal $S_{on}$. As a result, the pressure in the above mentioned load lock portion 66 becomes at the atmospheric pressure after receiving the filling stop signal $S_{off}$, and the tin filling mechanism 60 repeats to set inside the load lock portion 66 to be in the vacuum state and in the atmospheric pressure state alternately before receiving the subsequent filling start signal $S_{on}$. In other words, during the time after receiving the filling stop signal $S_{off}$ and until receiving the subsequent filling start signal $S_{on}$, the pressure in the load lock portion 66 becomes at the atmospheric pressure state for the first time after receiving the filling stop signal $S_{off}$, and subsequently becomes in a vacuum state at least once then becomes at the atmospheric pressure state at least for the second time.

As apparent from the above, by measuring the pressure in the load lock portion 66 by the manometer 66c and transmitting the pressure information to the controller 50, the controller 50 is capable of detecting the filling operation of the tin filling mechanism 60. In other words, it makes it possible to allow the manometer 66c to function as a mechanism for detecting the filling operation of the tin filling mechanism 60.

Modifications and Applications

Although, in the above mentioned embodiments, a certain example has been described in which the laser is employed for the energy beam to be irradiated onto the high temperature plasma raw material, alternatively, an ion beam or an electron beam or the like may be employed in place of the laser.

Also, in the above mentioned embodiments, a certain example has been described to be applied to the EUV light source device of the DPP type, those embodiments may be also applied to the EUV light source device of the LPP type. The LPP type EUV light source device is a device employing a method in which the target material is irradiated with the driver laser for generating the plasma, and the target material is excited to generate the plasma.

Figure 10:
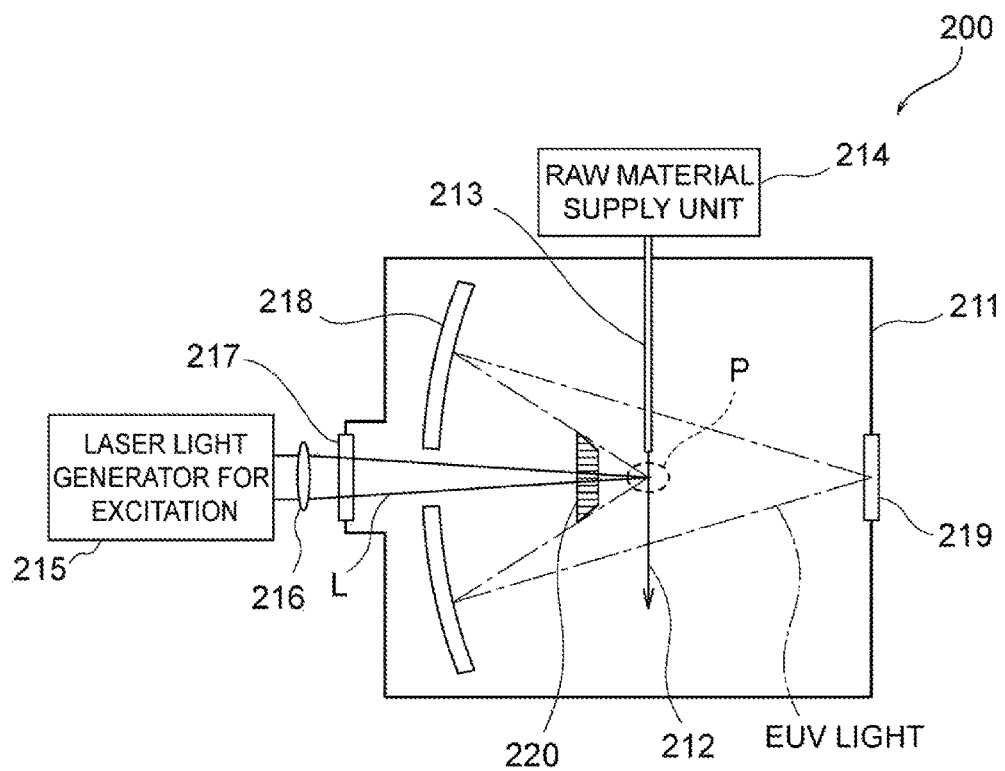
FIG. 10 is a schematic view showing a configuration of one illustrative example of an extreme ultraviolet light source device of an LPP type.

FIG. 10 is a view showing an EUV light source device 200 of the LPP type.

As shown in FIG. 10, the EUV light source device 200 is provided with a light source chamber 211. Inside the light source chamber 211 is kept in a vacuum state by a vacuum pump or the like.

The light source chamber 211 is provided with a raw material supply nozzle 213 for supplying the raw material as the EUV radiation species (high temperature plasma raw material) 212. The raw material supply nozzle 213 supplies the raw material 212 (for example, the tin in the liquid droplet state) supplied from the raw material supply unit 214 to a predetermined target area.

In addition, the EUV light source device 200 is provided with a laser light generation device for excitation (energy beam irradiation unit) 215 for emitting the laser light L. The laser light L emitted from the laser light generation device for excitation 215 is condensed by the laser light condensing unit 216 and enters inside the chamber 211 through a laser light incident window 217 formed at the chamber 211. The laser light L incident inside the chamber 211 passes through the laser light transmissive hole, which is provided in a substantially center portion of the EUV light condensing mirror (light condensing mirror) 218, and is radiated onto the raw material 212 ejected from the raw material supply nozzle 213.

The laser light generation device for excitation 215 is a pulsed laser device having a repetition (cyclic) frequency of several kHz, and a carbon dioxide gas ($CO_2$) laser, or a YAG laser or the like may be employed.

The raw material, which is supplied to the target area from the raw material supply nozzle 213, is heated and excited by irradiation with the laser light L to become the high temperature plasma P, and the EUV light is emitted from the high temperature plasma P. The emitted EUV light is reflected by the EUV light condensing mirror 218 toward the EUV light extraction unit 219 formed in the chamber 211, and condensed at a light condensing point (intermediate focal point) of the EUV light condensing mirror 218 so as to be emitted from the EUV light extraction unit 219. The EUV light emitted from the EUV light extraction unit 219 enters into an irradiation optical system or the like of the exposure device connected to the EUV light source device 200, which is not shown. Also, between the high temperature plasma P and the EUV light condensing mirror 218, a debris trap 220 is arranged that traps the debris generated from the high temperature plasma P and allows the EUV light only to pass through.

It should be noted that, as the above mentioned raw material 212 is heated and excited by the irradiation with the pulsed laser to become the high temperature plasma P, the light emission of the EUV light becomes a pulsed light emission.

Here, the EUV light condensing mirror 218 is a reflector mirror having a spherical shape that is coated with a multilayer film of, for example, molybdenum and silicon. The laser light transmissive hole may not be required depending on the arrangement of the laser light generation device for excitation 215 and the laser light incident window 217.

In addition, in some cases, the laser light L for generating the high temperature plasma may reach the EUV light extraction unit 219 as stray light. For this reason, a spectral purity filter may be arranged at a front side of the EUV light extraction unit 219 (that is, the high temperature plasma P side) that allows the EUV light to transmit and prevent the laser light L from transmitting, which is not shown.

Yet furthermore, although, in the above mentioned embodiments, a certain example has been described in which the EUV light source device is employed as a light source for the exposure of the semiconductor, it is not limited to those described above. For example, the above mentioned embodiments may be used as a light source for an inspection device or the like for a mask for the exposure.

Although in the above, certain embodiments have been described, it should be understood that those embodiments are merely described in an exemplary manner and not intended to limit the scope of the present invention. The device and the method disclosed in the original disclosure in the description and the drawings can be implemented in any embodiments other than those described above. Also, any omission, replacement and modification may be made as appropriate with respect to the above mentioned embodiments without departing from the scope of the present invention. Those embodiments to which those omission, replacement or modification is made falls within those recited in the appended claims and any equivalents thereof and a technical scope of the present invention.

REFERENCE SIGNS LIST

11 Chamber
11a Partition Wall
11b Discharge Space
11c Light Condensing Space
11d EUV Light Extraction Unit
12 EUV Light Condensing Mirror
13 Foil Trap
21a, 21b Discharge Electrode
22a, 22b High Temperature Plasma Raw Material
23a, 23b Container
24a, 24b Motor
25a, 25b Rotary Shaft
26a, 26b Mechanical Seal
27 Pulsed Power Supply Unit
28 Laser Source
30 Tin Supply Mechanism
31 Reservoir
32 Tin Discharge Port
33 Tin Supply Port
34 Tin Supply Tube
35 Pump
36 Cooling Mechanism
37 Tin Discharge Port
38 Tin Flow Back Port
39 Tin Discharge Tube
41 Upper Limit Level Sensor
411 Sensing Unit
412 Ammeter
413 Battery
42 Refilling Level Sensor
43 Lower Limit Level Sensor
50 Controller
60 Tin Filling Mechanism
100 Extreme Ultra Violet Light Source Device (EUV Light Source Device)
200 Extreme Ultra Violet Light Source Device (EUV Light Source Device)

What is claimed is:

1. A liquid level detection device for detecting a liquid level, comprising:
a reservoir configured to contain a high temperature plasma raw material in a liquid state for generating a high temperature plasma;
a first liquid level detection unit configured to electrically detect that a liquid level of the high temperature plasma raw material is elevated to reach a first liquid level; and
a second liquid level detection unit configured to thermally detect that the liquid level of the high temperature plasma raw material is lowered to reach a second liquid level that is lower than the first liquid level,
the first liquid level being an upper limit level that allows the high temperature plasma raw material to be contained in the reservoir, wherein
the first liquid level detection unit includes an electrode rod arranged in the reservoir and having a front edge positioned at a same or a substantially same height as the first liquid level, and
the second liquid level detection unit includes a temperature sensor arranged in the reservoir and configured to be positioned at a same or a substantially same height as the second liquid level.

2. The liquid level detection device according to claim 1, wherein
a conductive circuit configured to be in a conductive state when the front edge of the electrode rod contacts the liquid surface of the high temperature plasma raw material.

3. The liquid level detection device according to claim 1, wherein a surface of the electrode rod is constituted with a conductive material inert with respect to the high temperature plasma raw material.

4. The liquid level detection device according to claim 3, wherein a titanium nitride coating that is the conductive material inert with respect to the high temperature plasma raw material is applied to a surface of stainless steel of the electrode rod.

5. The liquid level detection device according to claim 3, wherein a material of the surface of the electrode rod is one of tungsten and molybdenum that is the conductive material inert with respect to the high temperature plasma raw material.

6. The liquid level detection device according to claim 1, wherein
the first liquid level detection unit further includes a tubular member configured to be fitted onto the electrode rod and to have an anticorrosion property to the high temperature plasma raw material as well as an electrically insulating property, and
the front edge of the electrode rod is exposed from the tubular member toward a liquid surface of the high temperature plasma raw material.

7. The liquid level detection device according to claim 6, wherein a material of the tubular member is aluminum oxide.

8. The liquid level detection device according to claim 1, wherein
the electrode rod is arranged such that a longitudinal direction thereof coincides or substantially coincides with a vertical direction.

9. The liquid level detection device according to claim 1, wherein a surface of the temperature sensor is constituted with a material inert with respect to the high temperature plasma raw material.

10. The liquid level detection device according to claim 9, wherein the material constituting the surface of the temperature sensor that is inert with respect to the high temperature plasma raw material is any of titanium nitride, tin oxide, aluminum oxide, diamond, tungsten, and molybdenum.

11. A liquid level detection device for detecting a liquid level, comprising:
a reservoir configured to contain a high temperature plasma raw material in a liquid state for generating a high temperature plasma;
an electrode rod arranged on the reservoir and having a front edge thereof arranged to be positioned at a same or a substantially same height as a first liquid level and a surface constituted with a conductive material inert with respect to the high temperature plasma raw material;
a tubular member configured to be fitted onto the electrode rode such that the front edge of the electrode rode is exposed toward a liquid surface of the high temperature plasma raw material and constituted with a material having an anticorrosion property and an electrically insulating property to the high temperature plasma raw material;

a conductive circuit configured to be in an electrically conducive state when the front edge of the electrode rod contacts the liquid surface of the high temperature plasma raw material; and a temperature sensor arranged in the reservoir and configured to be positioned at a same or a substantially same height as a second liquid level that is lower than the first liquid level, a titanium oxide coating being applied to a surface of stainless steel of the electrode rod, and a material of the tubular member being aluminum oxide.

12. A method of detecting a liquid level, comprising:

detecting, using a first liquid level sensor, that a liquid level of a high temperature plasma raw material in a liquid state for generating a high temperature plasma is elevated to reach a first liquid level that is an upper limit level to allow the high temperature plasma raw material to be contained in a reservoir; and detecting, using a second liquid level sensor, that the liquid level of the high temperature plasma raw material is lowered to reach a second liquid level that is lower than the first liquid level, wherein the first liquid level sensor is an electrode rod arranged in the reservoir and having a front edge positioned at a same or a substantially same height as the first liquid level, and the second liquid level sensor is a temperature sensor arranged in the reservoir and configured to be positioned at a same or a substantially same height as the second liquid level.

13. A high temperature plasma raw material supply device for supplying a high temperature plasma generation unit for generating a high temperature plasma with a high temperature plasma raw material in a liquid state contained in a reservoir, comprising:

a liquid level detection device according to claim 1; and a high temperature plasma filling controller configured to fill the high temperature plasma raw material in the reservoir based on a liquid level of the high temperature plasma raw material detected by the liquid level detection device.

14. The high temperature plasma raw material supply device according to claim 13, wherein the second liquid level is a to-be-filled level requiring the high temperature plasma raw material to be filled in the reservoir, and the high temperature plasma controller includes:

a filling start unit configured to start filling the high temperature plasma raw material in the reservoir when the second liquid level detection unit detects that the liquid level of the high temperature plasma raw material in the reservoir reaches the to-be-filled level; and a filling stop unit configured to stop filling the high temperature plasma raw material in the reservoir when the first liquid level detection unit detects that the liquid level of the high temperature plasma raw material in the reservoir reaches the upper limit level after the filing start unit starts filling the high temperature plasma raw material.

15. The high temperature plasma raw material supply device according to claim 14, further comprising:

a filled amount measurement unit configured to measure an actual measured filled amount that is an amount of the high temperature plasma raw material filled in the reservoir from when the filling start unit starts filling the high temperature plasma raw material until the filling stop unit stops filling the high temperature plasma raw material in the reservoir; and an error information output unit configured to compare the actual measured filled amount measured by the filled amount measurement unit with a referential to-be-filled amount fillable in the reservoir from when the liquid level of the high temperature plasma raw material is at the to-be-filled level until the liquid level of the high temperature plasma raw material reaches the upper limit level and to output error information when a difference therebetween exceeds an allowable value preset in advance.

16. The high temperature plasma raw material supply device according to claim 13, further comprising:

a third liquid level detection unit having a same configuration as the second liquid level detection unit and configured to detect that the liquid level of the high temperature plasma raw material is lowered to reach a third liquid level that is a lower limit level at minimum requiring the high temperature plasma raw material to be contained in the reservoir; and a high temperature plasma raw material supply stop unit configured to stop supplying the high temperature plasma raw material to the high temperature plasma generation unit from the reservoir when the third liquid level detection unit detects that the liquid level of the high temperature plasma raw material in the reservoir reaches the lower limit level.

17. An extreme ultra violet light source device for radiating extreme ultra violet light, comprising:

a high temperature plasma raw material supply device according to claim 13; and a high temperature plasma generation unit configured to heat and excite the high temperature plasma raw material supplied from the high temperature plasma raw material supply device to generate a high temperature plasma.

* * * * *